US011191182B1

(12) United States Patent
Wilson et al.

(10) Patent No.: US 11,191,182 B1
(45) Date of Patent: Nov. 30, 2021

(54) UNIVERSAL RAIL KIT

(71) Applicant: SambaNova Systems, Inc., Palo Alto, CA (US)

(72) Inventors: Peter Alexander Wilson, San Jose, CA (US); Jeffrey Kiely, San Jose, CA (US)

(*) Notice: Subject to any disclaimer, the term of this patent is extended or adjusted under 35 U.S.C. 154(b) by 0 days.

(21) Appl. No.: 17/216,509

(22) Filed: Mar. 29, 2021

(51) Int. Cl.
*H05K 7/18* (2006.01)
*H05K 5/02* (2006.01)

(52) U.S. Cl.
CPC .......... *H05K 7/183* (2013.01); *H05K 5/0204* (2013.01)

(58) Field of Classification Search
CPC ....................................... H05K 5/02
See application file for complete search history.

(56) References Cited

U.S. PATENT DOCUMENTS

| 10,912,221 B2* | 2/2021 | Yeh | H05K 7/1401 |
| 2012/0069514 A1* | 3/2012 | Ross | H05K 7/20727 |
| | | | 361/679.33 |

* cited by examiner

*Primary Examiner* — Jerry Wu
(74) *Attorney, Agent, or Firm* — Haynes Beffel & Wolfeld LLP; Sikander Khan; Andrew Dunlap

(57) ABSTRACT

A universal rail mounting kit for mounting a rack-mountable computing device within a computer rack is provided. The universal rail mounting kit includes a rack-mountable sliding rail configured to be attached to the computer rack, a device-mountable receiving rail configured to be attached to the rack-mountable computing device and configured to receive the rack-mountable sliding rail when the rack-mountable computing device is installed in the computer rack, and a device-mountable securing rail configured to be attached to the rack-mountable computing device and configured to secure the rack-mountable computing device to the computer rack after the device-mountable receiving rail has received the rack-mountable sliding rail.

17 Claims, 18 Drawing Sheets

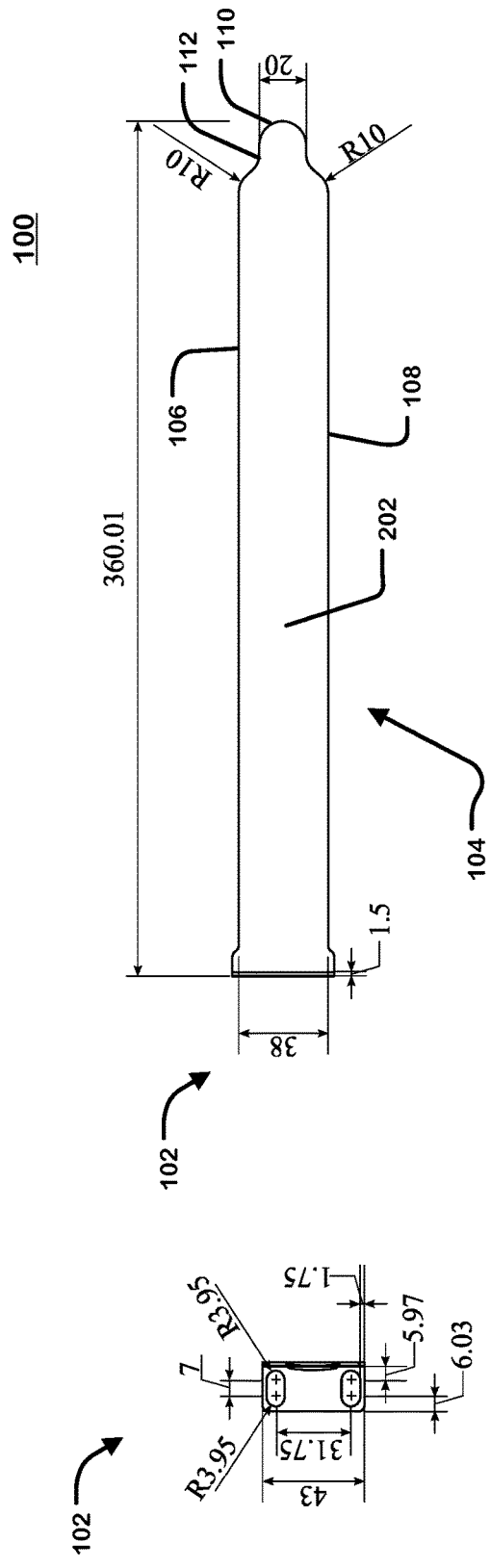
FIG. 8A
FIG. 8B
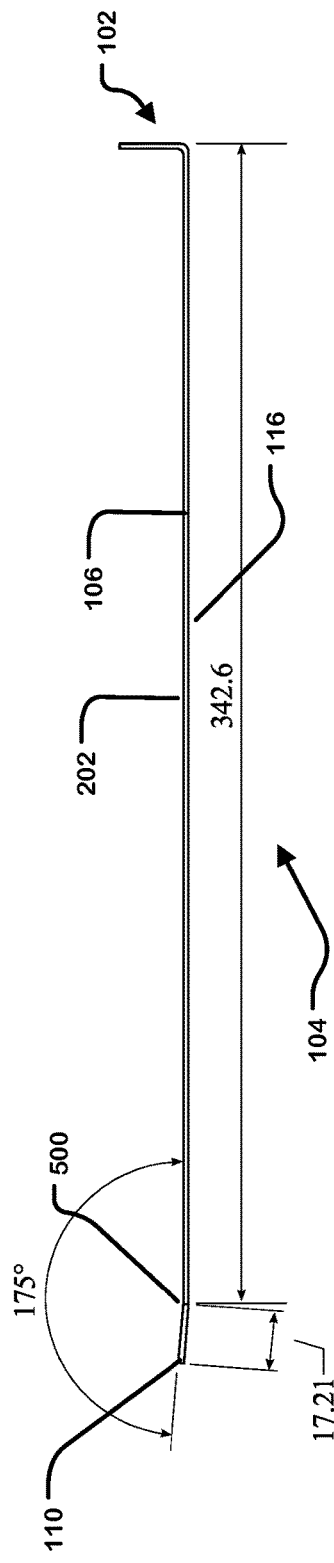
FIG. 9

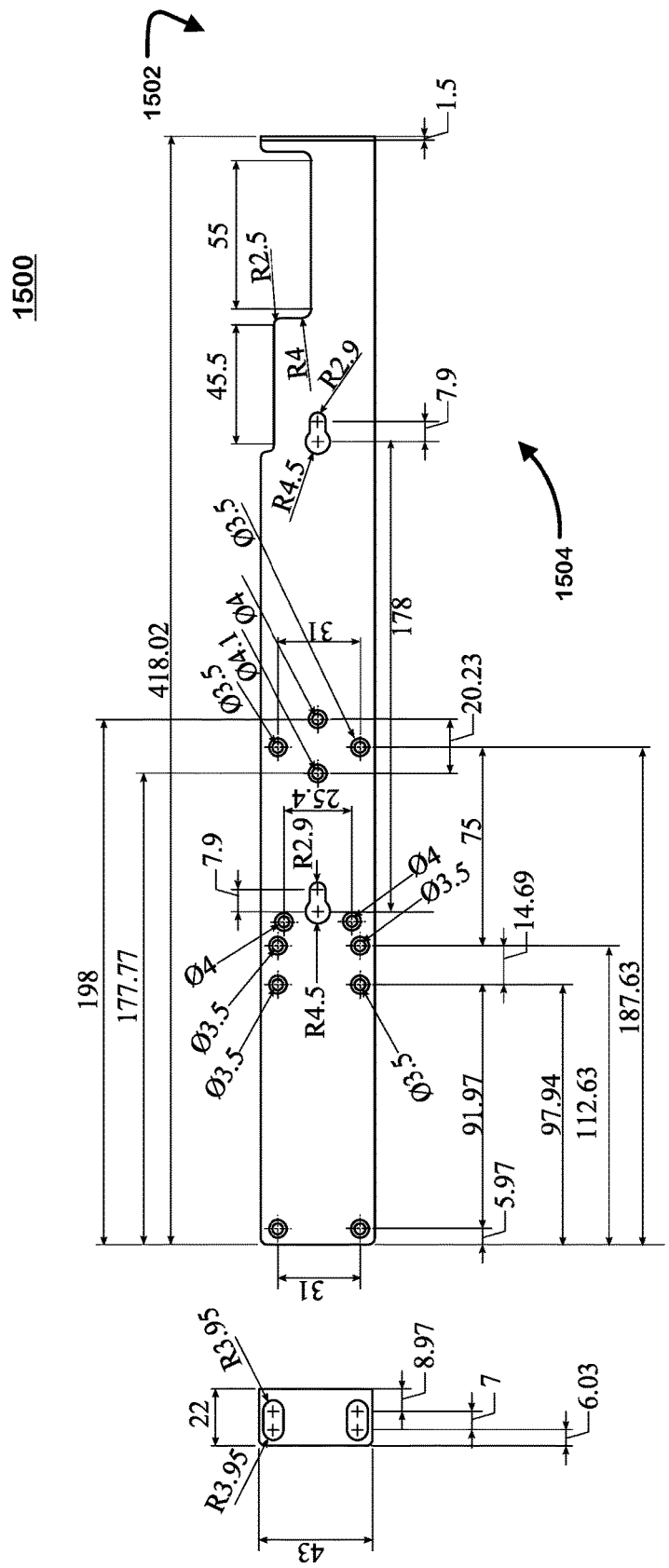
FIG. 18B
FIG. 18A
FIG. 19

UNIVERSAL RAIL KIT

BACKGROUND OF THE INVENTION

The subject matter discussed in this section should not be assumed to be prior art merely as a result of its mention in this section. Similarly, a problem mentioned in this section or associated with the subject matter provided as background should not be assumed to have been previously recognized in the prior art. The subject matter in this section merely represents different approaches, which in and of themselves can also correspond to implementations of the claimed technology.

A computer rack, often times referred to as a network rack or a server rack, includes a metal frame and chassis (including pillars) that hold, stack organize and secure rack-mountable computing devices such as rack-mountable computers, rack-mountable routers and rack-mountable data switches. Computer racks are designed to be located in server rooms and allow for easy access to the rack-mountable computing devices installed therein. The various rack-mountable computing devices installed in the computer rack have different dimensions (i.e., height, width and depth) and weights. For example, a data switch that is capable of providing data to 100 computing devices on a network will have certain dimensions that are different from the dimensions of a rack-mountable computing device that includes 6 processors, 6 data storage devices and a backup power supply.

Rail kits, which are used to hold and secure the rack-mountable computing devices in the computer rack, are provided as original equipment manufacturer (OEM) parts by either the manufacturer of the rack-mountable computing devices or the manufacturer of the computer rack. Typically, the OEM rail kits are provided by the manufacturer of the rack-mountable computing devices, as opposed to the computer rack manufacturers, because the rack-mountable computing devices have different dimensions and weights and because the manufacturers of the rack-mountable computing devices are more likely to design rail kits that meet the specific dimensions and weight requirements of their specific rack-mountable computing devices. Further, the rack-mountable computing devices are structured in such a way that they have different mounting locations to which their respective OEM rail kits can be attached and they use different methods of attaching their respective OEM rail kits (e.g., screws, protrusions mounted on the rack-mountable computing devices, clips, etc.). For example, a data switch provided by Cisco® will have a specific pattern of holes for receiving screws to mount its OEM rail kit and a data switch provided by Juniper Networks® will have a different pattern of holes for receiving screws to mount its OEM rail kit. Therefore, different rail kits are necessary for installing the Cisco® data switch as opposed to the Juniper data switch. Furthermore, each vendor (e.g., Cisco®, Juniper®, Nvidia®, etc.) provides different models of, for example, data switches, such that the different models of data switches can require different OEM rail kits. Therefore, a need arises for a universal rail kit that is structured and configured to be able to install different models of rack-mountable computer devices from multiple vendors (e.g., Cisco®, Juniper®, Nvidia®, etc.).

Additionally, the OEM rail kits provided by the equipment manufacturers or vendors and/or the OEM rail kits provided by the computer rack manufacturer are not sturdy enough to allow for shipping of various rack-mountable computing devices while installed in a computer rack. Typically, a computer rack is purchased from a particular manufacturer and the rack-mountable computing devices are purchased from other manufacturers. The end user receives the computer rack and various rack-mountable computing devices separately and then configures and installs the various rack-mountable computing devices into the computer rack. These OEM rail kits have been failing to secure the rack-mountable computing devices to the computer rack when the computer rack is shipped to another location. Specifically, the OEM rail kits are not sturdy enough to secure the rack-mountable computing devices so that they survive shipping. As a result, the OEM rail kits will have a point of failure and the computer rack will arrive with the rack-mountable computing devices damaged or displaced from their original locations. Therefore, a need arises for a universal rail kit that is sturdy enough to allow for the shipment of the computer rack and the installed rack-mountable computing devices without damage or displacement of the rack-mountable computing devices.

Moreover, OEM rail kits do not have a structure that provides sufficient space for routing cables throughout the computing rack with the various rack-mountable computing devices installed therein. Specifically, the dimensions, locations and sizes of the OEM rail kits are such that cables cannot be routed as desired by the end user, thus requiring the end user to rout cables in an inefficient manner. For example, some OEM rail kits as well as third party rail kits extend along an entire length or a substantial portion of a length of a rack-mountable computing device and some OEM rail kits as well as third party rail kits have heights and/or thicknesses that take up much more space than necessary. As a result, cables cannot be routed between or along the side of the rack-mountable computing device because the components of the rail kits are in the way. Therefore, a need arises for a universal rail kit that allows for easy and efficient routing of cables within the computer rack when the various rack-mountable computing devices are installed therein, which will allow equipment users and service technicians to more efficiently setup, configure and service computer racks and the rack-mountable computing devices installed therein.

SUMMARY

A summary is provided herein to help enable a basic or general understanding of various aspects of exemplary, non-limiting implementations that follow in the more detailed description and the accompanying drawings. This summary is not intended, however, as an extensive or exhaustive overview. Instead, the sole purpose of this summary is to present some concepts related to some exemplary non-limiting implementations in a simplified form as a prelude to the more detailed description of the various implementations that follow.

A universal rail kit is described herein. The universal rail kit (i) is compatible with many different makes and models of rack-mountable computing devices, (ii) allows for easy and efficient routing of cables in a computer rack and (iii) is capable of securely mounting a rack-mountable computing device to a computer rack, such that the computer rack and the rack-mountable computing device installed therein can withstand shipment without damage to the rail kit or the rack-mountable computing device and without the rack-mountable computing device being separated from the computer rack.

In an implementation, a universal rail mounting kit for mounting a rack-mountable computing device within a computer rack is provided. The universal rail mounting kit can include a rack-mountable sliding rail configured to be attached to the computer rack, a device-mountable receiving rail configured to be attached to the rack-mountable computing device and configured to receive the rack-mountable sliding rail when the rack-mountable computing device is installed in the computer rack, and a device-mountable securing rail configured to be attached to the rack-mountable computing device and configured to secure the rack-mountable computing device to the computer rack after the device-mountable receiving rail has received the rack-mountable sliding rail.

Further, in an implementation, the rack-mountable sliding rail can have an "L" shaped structure including a distal end, a proximal end, a first leg located at the distal end and a second leg extending from the distal end to the proximal end, wherein the first leg can be being shorter than the second leg.

In another implementation, the first leg of the rack-mountable sliding rail can be configured to be mounted to a pillar of the computer rack.

In an implementation, the first leg can include at least one via hole for receiving a mounting component that attaches the first leg to the pillar of the computer rack.

In a further implementation, the second leg of the rack-mountable sliding rail can be configured to extend along a side of the rack-mountable computing device when the first leg of the rack-mountable sliding rail is mounted to the pillar of the computer rack and the rack-mountable computing device is installed within the computer rack.

In an implementation, the second leg, at the proximal end of the rack-mountable sliding rail, can include a rounded portion to provide guidance to the device-mountable receiving rail as the rack-mountable computing device is installed within the computer rack.

In another implementation, the second leg, at the proximal end of the rack-mountable sliding rail, can be further tapered from the rounded portion to provide further guidance to the device-mountable receiving rail as the rack-mountable computing device is installed within the computer rack.

In an implementation, the first leg can have a first end connected to the second leg and a second end opposing the first end, and the second leg, at the proximal end of the rack-mountable sliding rail, can be angled in a direction towards the second end of the first leg to provide guidance to the device-mountable receiving rail as the rack-mountable computing device is installed within the computer rack.

In a further implementation, the device-mountable receiving rail can include a distal end, a proximal end, a top side and a bottom side. The top side can form a "U" shaped curved region configured to curve away from a side of the rack-mountable computing device and to form a top-side track extending along a portion of a length of the device-mountable receiving rail, and the bottom side can form a "U" shaped curved region configured to curve away from the side of the rack-mountable computing device and to form a bottom-side track extending along a portion of a length of the device-mountable receiving rail.

In an implementation, the second leg of the rack-mountable sliding rail can include a top side extending along a portion of a length thereof and a bottom side extending along a portion of a length thereof. The top-side track of the device-mountable receiving rail can be configured to receive the top side of the second leg of the rack-mountable sliding rail, and the bottom-side track of the device-mountable receiving rail can be configured to receive the bottom side of the second leg of the rack-mountable sliding rail.

In another implementation, at least one of the "U" shaped curved region of the top side of the device-mountable receiving rail and the "U" shaped curved region of the bottom side of the device-mountable receiving rail can include one or more openings adjacent to one or more via holes of the device-mountable receiving rail to allow for insertion and removal of mounting components.

In an embodiment the device-mountable securing rail can have an "L" shaped structure comprising a distal end, a proximal end, a first leg located at the proximal end and a second leg extending from the proximal end to the distal end, the first leg being shorter than the second leg. The second leg of the device-mountable securing rail can be configured to be mounted to and extend along a side of the rack-mountable computing device, and, upon insertion of the second leg of the rack-mountable sliding rail into the first device-mountable sliding rail, the first leg of the device-mountable securing rail can be configured to be mounted to another pillar of the computer rack.

In a further implementation, the second leg can be step-wise tapered towards the proximal end of the device-mountable securing rail to have a reduced a height of the second leg at the proximal end of the device-mountable securing rail in comparison to a height of the second leg at the distal end of the device-mountable securing rail.

In an implementation, the device-mountable securing rail can include two or more via holes for receiving mounting components that attach the device-mountable securing rail to a side portion of the rack-mountable computing device. The two or more via holes can be located in positions that allow the device-mountable securing rail to be attached to rack-mountable computing devices provided from multiple manufacturers.

In another implementation, the device-mountable securing rail can include one or more receiving holes configured to receive one or more protrusions located on the side of the rack-mountable computing device. The one or more receiving holes can be located in positions that allow the device-mountable securing rail to be attached to rack-mountable computing devices provided from multiple manufacturers.

In an implementation, the multiple manufacturers can include two or more of Cisco®, Juniper Networks® and Nvidia®.

In a further implementation, the device-mountable receiving rail can include two or more via holes for receiving mounting components that attach the device-mountable receiving rail to a side portion of the rack-mountable computing device. The two or more via holes can be located in positions that allow the device-mountable receiving rail to be attached to rack-mountable computing devices provided from multiple manufacturers.

In an implementation, the device-mountable receiving rail can include one or more receiving holes configured to receive one or more protrusions located on the side of the rack-mountable computing device. The one or more receiving holes can be located in positions that allow the device-mountable receiving rail to be attached to rack-mountable computing devices provided from multiple manufacturers.

In another implementation, the rack-mountable sliding rail, the device-mountable receiving rail and the device-mountable securing rail can be configured to attach to a left side of the rack-mountable computing device, and the universal rail mounting kit can further include a complementary second set of components including another rack-mountable sliding rail, another device-mountable receiving rail and another device-mountable securing rail, which can be configured to attach to a right side of the rack-mountable computing device.

In an implementation, a method of installing a rack-mountable computing device within a computer rack using a universal rail mounting kit is provided. The universal rail mounting kit can include a rack-mountable sliding rail configured to be attached to the computer rack, a device-mountable receiving rail configured to be attached to the rack-mountable computing device and configured to receive the rack-mountable sliding rail when the rack-mountable computing device is installed in the computer rack and a device-mountable securing rail configured to be attached to the rack-mountable computing device and configured to secure the rack-mountable computing device to the computer rack after the device-mountable receiving rail has received the rack-mountable sliding rail. Further, the method can include attaching the rack-mountable sliding rail to a pillar of the computer rack, attaching the device-mountable receiving rail to a distal portion of a side of the rack-mountable computing device, attaching the device-mountable securing rail to a proximal portion of the side of the rack-mountable computing device, installing the rack-mountable computing device within the computer rack by sliding the device-mountable receiving rail attached to the rack-mountable computing device to receive rack-mountable sliding rail, and securing a portion of the device-mountable securing rail to another pillar of the computer rack.

Other features, aspects and advantages of the universal rail kit can be seen on review the drawings, the detailed description, and the claims, which follow.

BRIEF DESCRIPTION OF THE DRAWINGS

The included drawings are for illustrative purposes and serve only to provide examples of possible structures and process operations for one or more implementations of this disclosure. These drawings in no way limit any changes in form and detail that may be made by one skilled in the art without departing from the spirit and scope of this disclosure. A more complete understanding of the subject matter may be derived by referring to the detailed description and claims when considered in conjunction with the following figures, wherein like reference numbers refer to similar elements throughout the figures.

FIGS. 8A and 8B illustrate example dimensions of the structure of the rack-mountable sliding rail of a universal rail kit.

FIG. 9 illustrates example dimensions of the structure of the rack-mountable sliding rail of a universal rail kit.

FIGS. 18A and 18B illustrate example dimensions of the structure of a device-mountable securing rail of a universal rail kit.

FIG. 19 illustrates example dimensions of the structure of a device-mountable securing rail of a universal rail kit.

DESCRIPTION OF THE INVENTION

Figure 1:
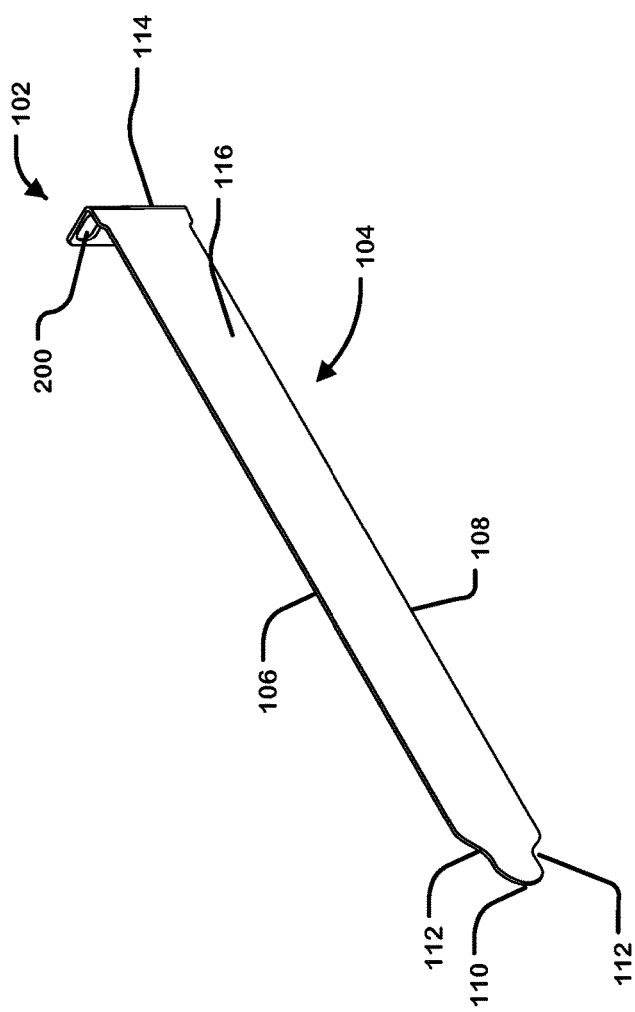
FIG. 1 illustrates a first perspective view of a rack-mountable sliding rail of a universal rail kit.

The technology disclosed describes a universal rail kit that is configured to adapt to rack-mountable computer devices provided from multiple manufacturers or vendors. Specifically, the universal rail kit includes components that can be universally used to install varying models and brands of rack-mountable computer devices in a computer rack.

The universal rail kit includes a right set and a left set of components (rails) to be installed for the right side and the left side of a rack-mountable computer device. Each set (i.e., the right set and the left set) of rails includes (i) a rack-mountable sliding rail that is initially mounted onto a pillar or chassis component of the computer rack, (ii) a device-mountable receiving rail that is initially mounted onto (a distal end or portion of) the corresponding side of the rack-mountable computer device and (iii) a device-mountable securing rail that is initially mounted onto (a proximal end or portion of) the corresponding side of the rack-mountable computer device. Once the rack-mountable sliding rail is mounted to the pillar or chassis component and the device-mountable receiving rail and the device-mountable securing rail are mounted to the rack-mountable computer device, the device-mountable receiving rail can be aligned with the rack-mountable sliding rail while the rack-mountable computing device is slid into place within the computer rack. The device-mountable receiving rail receives the rack-mountable sliding rail. The rack-mountable sliding rail provides support for the device-mountable receiving rail, as it is mounted to the pillar of the computer rack.

Once the rack-mountable computing device is slid into place the device-mountable securing rail, which is installed on the proximal end of the corresponding side of the rack-mountable computing device, is aligned with and mounted to another pillar or chassis component of the computer rack using mounting components, such as screws, clips, etc. Therefore, both the rack-mountable sliding rail and the device-mountable securing rail are mounted (attached) to pillars of the computer rack to provide secure support to keep the rack-mountable computing device in place, while the device-mountable receiving rail also provides secure support by being attached to the rack-mountable sliding rail. The device-mountable receiving rail also allows for easy installation of the rack-mountable computing device as it is aligned with the device-mountable receiving rail during installation of the rack-mountable computing device. Once installed, the rack-mountable sliding rail, the device-mountable receiving rail and the rack-mountable securing rail are stationary with respect to one another and the computer rack. The rails may not slide forwards or backwards like other sliding-type rail kits that are bulky and make routing of cables more difficult.

The rack-mountable computing device can also be removed from the computer rack by simply removing the mounting components that attach the device-mounted securing rail from the pillar of the computer rack and then sliding the rack-mountable computing device out of the computer rack. The structure of the rack-mountable sliding rail, the device-mountable receiving rail and the device-mountable securing rail allows the rack-mountable computing device to be removed without detaching the rack-mountable sliding rail from the pillar of the computer rack, without detaching the device-mountable receiving rail from the rack-mountable computing device and without detaching the device-mountable securing rail from the rack-mountable computing device.

Each of the above-described components of the universal rail kit are designed with via holes and receiving holes that allow for mounting onto various models and brands of rack-mountable computing devices. Further, each of the above-described components has a structure that allows sufficient space between various rack-mountable computing devices and other components of the computer rack, so that various wires and cables can be routed throughout the computer rack.

Each of the rack-mountable securing rail, the device-mountable receiving rail and the device-mountable securing rail can have a unibody structure and can be comprised of a metal, such as steel (e.g., cold rolled steel (e.g., 0.059 inches) with anti-corrosion zinc coating), a plastic or a composite material with or without coatings.

Specific components of the universal rail kit are described below along with their structures and functions with reference to FIGS. 1-23.

FIG. 1 illustrates a first perspective view of a rack-mountable sliding rail of a universal rail kit.

Specifically, FIG. 1 illustrates a rack-mountable sliding rail 100 of the universal rail kit. The rack-mountable sliding rail 100 is "L" shaped and has a first leg 102 and a second leg 104. The first leg 102 is located at a distal end of the rack-mountable sliding rail 100 and the second leg 104 extends from the distal end of the rack-mountable sliding rail 100 to a proximal end of the rack-mountable sliding rail 100. As illustrated, the first leg 102 can be shorter than the second leg 104.

The second leg 104 includes a top portion 106, a bottom portion 108 and a first side 116 that faces towards the rack-mountable computing device when it is installed within the computer rack.

Additionally, the second leg 104, at the proximal end can include a curved or rounded tip 110 (rounded portion) that can help provide guidance as the rack-mountable sliding rail 100 is received by (slide into) a device-mountable receiving rail 1000, which is described in more detail below with reference to FIGS. 10-14. The proximal end of the second leg 104 can also further include tapered portions 112 so as to provide further assistance with aligning the rack-mountable sliding rail 100 with the device-mountable receiving rail 1000, which is mounted to the rack-mountable computing device.

A length of the first leg 102 of the rack-mountable sliding rail 100 extends in a direction that is substantially perpendicular to the length of the second leg 104. As illustrated, the rack-mountable sliding rail 100 is of a unibody shape and the first leg 102 and the second leg 104 meet at a corner or rounded portion 114 thereof. The first leg 102 includes one or more via holes 200 that allow the rack-mountable sliding rail 100 to be mounted (attached) to a pillar or chassis component of the computer rack using one or more mounting components, such as screws, bolts, clips or other devices that would be known to a person of ordinary skill in the art. The mounting components can be inserted into the via holes 200 in order to mount the rack-mountable sliding rail 100 to the pillar and they can be removed from the via holes 200 in order to remove the rack-mountable sliding rail 100 from the pillar. Once the rack-mountable sliding rail 100 is mounted to the pillar of the computer rack, the device-mountable receiving rail 1000 can receive the rack-mountable sliding rail 100 during installation of the rack-mountable computing device. The rack-mountable sliding rail 100, as illustrated in FIG. 1, can be installed on either the left side or the right side of the computer rack. Although two rack-mountable sliding rails 100 are not illustrated, the universal rail kit includes another corresponding rack-mountable sliding rail that can be installed on the other side of the computer rack. This other corresponding rack-mountable sliding rail can have the same structure as the rack-mountable sliding rail 100 illustrated in FIG. 1 or it can have a structure that is different from the rack mountable sliding rail 100 illustrated in FIG. 1.

Figure 2:
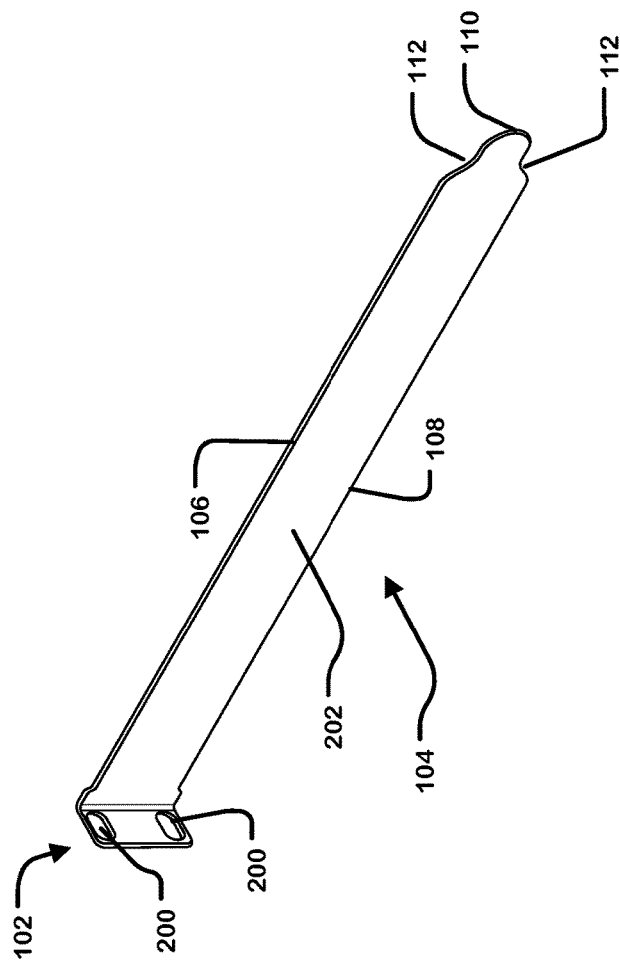
FIG. 2 illustrates a second perspective view of a rack-mountable sliding rail of a universal rail kit.

FIG. 2 illustrates a second perspective view of a rack-mountable sliding rail of a universal rail kit.

FIG. 2 illustrates the same rack-mountable sliding rail 100 as illustrated in FIG. 1 and redundant descriptions thereof are omitted. FIG. 2 further illustrates that multiple via holes 200 are included in the first leg 102 of the rack-mountable sliding rail 100. Additionally, FIG. 2 illustrates a second side 202 of the second leg 104 that faces away from the rack-mountable computing device when it is installed within the computer rack.

Figure 3:
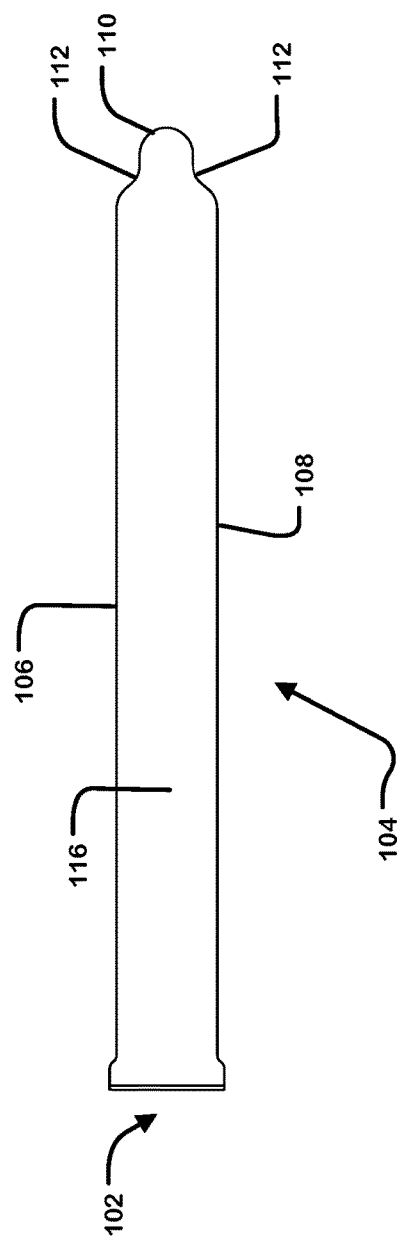
FIG. 3 illustrates a side view of a rack-mountable sliding rail of a universal rail kit.

FIG. 3 illustrates a side view of a rack-mountable sliding rail of a universal rail kit.

Specifically, FIG. 3 illustrates the same rack-mountable sliding rail 100 as illustrated in FIGS. 1 and 2 and redundant descriptions thereof are omitted.

Figure 4:
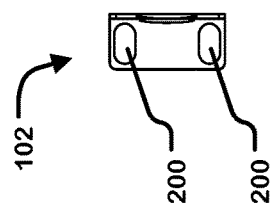
FIG. 4 illustrates a view from a proximal end of a rack-mountable sliding rail of a universal rail kit.

FIG. 4 illustrates a view from a proximal end of a rack-mountable sliding rail of a universal rail kit.

Specifically, FIG. 4 illustrates the two or more via holes 200 of the first leg 102 of the same rack-mountable sliding rail 100 as illustrated in FIGS. 1-3. The via holes 200 can be of any shape, such as circular or oblong. An oblong shape will allow for small left or right adjustments of the rack-mountable sliding rail 100 with respect to the pillar of the computer rack.

Figure 5:
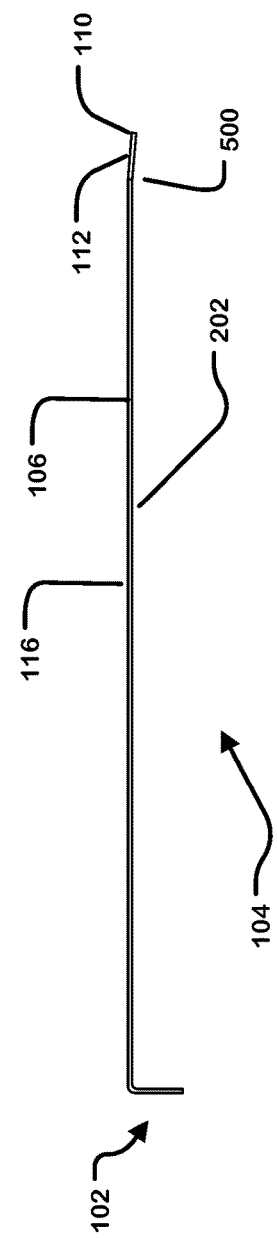
FIG. 5 illustrates a first profile view of a rack-mountable sliding rail of a universal rail kit.

FIG. 5 illustrates a first profile view of a rack-mountable sliding rail of a universal rail kit.

Specifically, FIG. 5 illustrates the same rack-mountable sliding rail 100 as illustrated in FIGS. 1-4 and redundant descriptions thereof are omitted. Further, FIG. 5 illustrates that the proximal end of the second leg 104 can be angled 500 in a direction away from the rack-mountable computing device as installed in the computer rack. The angle can be approximately 175 degrees (or 5 degrees away from perfectly flat). The angling 500 of the rack-mountable sliding rail 100 makes it easier for the device-mountable receiving rail 1000, which is described in further detail below with reference to FIGS. 10-14, to align with and receive the rack-mountable sliding rail 100 as the rack-mountable computing device is installed within the computer rack.

Figure 6:
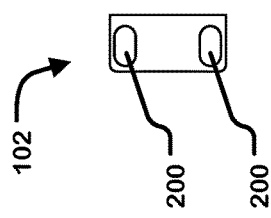
FIG. 6 illustrates a view from a distal end of a rack-mountable sliding rail of a universal rail kit.

FIG. 6 illustrates a view from a distal end of a rack-mountable sliding rail of a universal rail kit.

Specifically, FIG. 6 illustrates the opposite side of the first leg 102 that is illustrated in FIG. 4. Redundant description of the first leg 102 of FIG. 6 are omitted, as the first leg 102 is describe above with reference to FIGS. 1-5.

Figure 7:
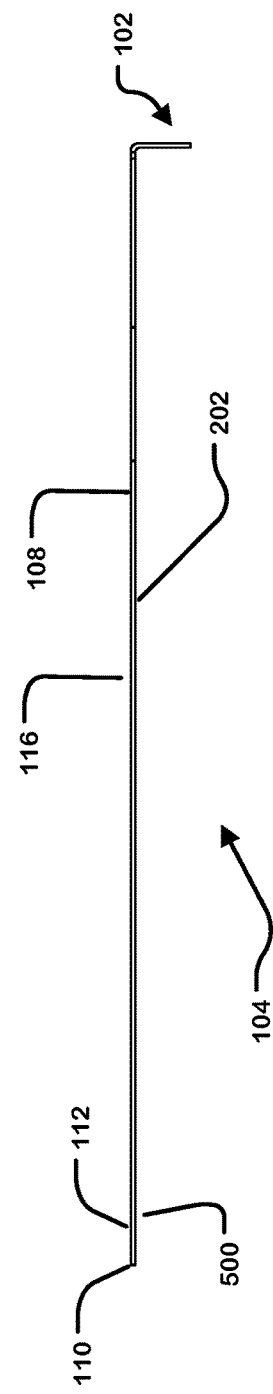
FIG. 7 illustrates a second profile view of a rack-mountable sliding rail of a universal rail kit.

FIG. 7 illustrates a second profile view of a rack-mountable sliding rail of a universal rail kit.

Specifically, FIG. 7 is similar to FIG. 5, except that FIG. 7 illustrates a view towards a bottom portion 108 of the rack-mountable sliding rail 100. Redundant descriptions of the rack-mountable sliding rail 100 as illustrated in FIG. 7 are omitted in view of the descriptions provided above with reference to FIGS. 1-6.

FIGS. 8A, 8B and 9 illustrate example dimensions of the structure of a rack-mountable sliding rail of a universal rail kit.

The measurements illustrated in FIGS. 8A, 8B and 9 are in millimeters (mm) and the "R" values indicate radius measurements in millimeters (mm). These measurements are merely examples and can be modified. The dimensions and shape of the rack-mountable sliding rail 100 allow the rack-mountable sliding rail 100 to be compatible with various brands and models of computer racks as well as with various brands and models of rack-mountable computing devices. Many of the reference elements (e.g., 114) illustrated in FIGS. 1-7 are not included in FIGS. 8A, 8B and 9 so as to allow for easier identification of the dimensions. Specifically, some of the reference elements referred to below are not illustrated in FIGS. 8A, 8B and 9 for the sake of clarity. However, it is clear from FIGS. 1-7 which portions of the rack-mountable sliding rail are being referred to below.

While the various dimensions and shapes illustrated in FIGS. 8A, 8B and 9 are self-explanatory, they are briefly described below. The overall length of the rack-mountable sliding rail 100 is approximately 360.01 mm, the height of the second leg 104 is approximately 38 mm, except at the distal end near the first leg 102 and the proximal end that includes the rounded tip 110 (rounded portion) and the tapered portions 112. The rounded tip 110 (rounded portion) can have a height of approximately 20 mm and the tapered portions 112 can have a radius measurement of R10 mm. The height of the first leg 102 (as well as the distal portion of the second leg 104) can be 43 mm, which is slightly more than the height of the middle portion of the second leg 104. The first leg 102 can have a length of approximately 19 mm. Left and right portions of the via holes 200 can have a radius measurement of R3.95 mm and the via holes 200 can be spaced apart from each other approximately 31.75 mm from the illustrated center points thereof. Additionally, the angle 500 formed near the proximal end of the second leg 104 can be approximately 175 degrees. A length of the rack-mountable sliding rail 100 from the distal end to a point at which the angle 500 is formed is approximately 342.6 mm.

Figure 10:
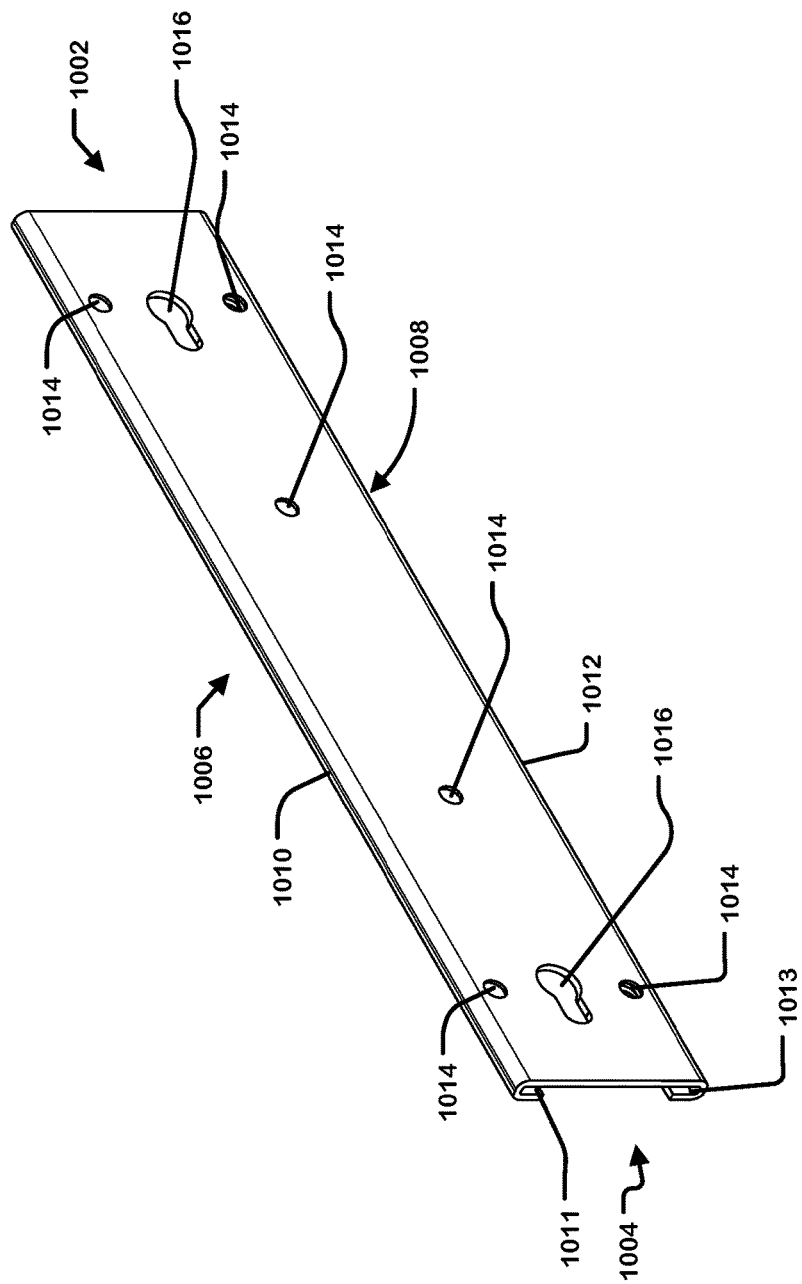
FIG. 10 illustrates a first perspective view of a device-mountable receiving rail of a universal rail kit.

FIG. 10 illustrates a first perspective view of a device-mountable receiving rail of a universal rail kit.

Specifically, FIG. 10 illustrates a device-mountable receiving rail 1000 that can be mounted to the rack-mountable computing device. The device-mountable receiving rail 1000 can include a distal end 1002, a proximal end 1004, a top side 1006 and a bottom side 1008. As illustrated in FIG. 10, the top side 1006 of the device-mountable receiving rail 1000 can be formed in a "U" shape to form a "U" shaped curved region 1010 which curves away from a side of the rack-mountable computing device to which the device-mountable receiving rail 1000 is mounted. The device-mountable receiving rail 1000 can be attached (mounted) to a distal portion of the side of the rack-mountable computing device. The "U" shaped curved region 1010 forms a top-side track 1011 that extends along (at least) a portion of the device-mountable receiving rail 1000. Similarly, the bottom side 1008 of the device-mountable receiving rail 1000 can be formed in a "U" shape to form a "U" shaped curved region 1012 which curves away from the side of the rack-mountable computing device to which the device-mountable receiving rail 1000 is mounted. The "U" shaped curved region 1012 forms a bottom-side track 1013 that extends along (at least) a portion of the device-mountable receiving rail 1000.

The top-side track 1011 and the bottom-side track 1013 are structured to respectively receive the top portion 106 and the bottom portion 108 of the rack-mountable sliding rail 100 as the rack-mountable computing device (having the device-mountable receiving rail 1000 attached thereto) is slid into the computing rack. The rounded tip 110 and the tapered portion 112 of the rack-mountable sliding rail 100 can guide (provide guidance to) the device-mountable receiving rail 1000 as the rack-mountable computing device is installed.

For example, during installation of the rack-mountable computing device, the rounded tip 110 can initially come into contact with either the top-side track 1011 or the bottom-side track 1013. As the rack-mountable computing device continues to slide into the computer rack, the tapered portions 112 can engage and slide along either the top-side track 1011 or the bottom-side track 1013. The rounded tip 110 and the tapered portions 112 allow the rack-mountable computing device to be installed without requiring the user to precisely align the top portion 106 and the bottom portion 108 of the rack-mountable sliding rail 100 with the top-side track 1011 and the bottom-side track 1013. As the rack-mountable computing device is eventually slid into place, the distal end 1002 of the device-mountable receiving rail 1000 will reach the distal end of the second leg 104 of the rack-mountable sliding rail 100.

The widths of the top-side track 1011 and the bottom-side track 1013 are commensurate with the thickness (width) of the rack-mountable sliding rail 100 and the distance between the top-side track 1011 and the bottom-side track 1013 is commensurate with the height of the rack-mountable sliding rail 100 (i.e., the distance between the top portion 106 and the bottom portion 108) such that the rack-mountable sliding rail 100 can slide into the top-side track 1011 and the bottom-side track 1013 without excessive force all the while keeping the rack-mountable sliding rail 100 in place so as to prevent movement of the rack-mountable computing device within the computer rack during shipment. Furthermore, as illustrated, the device-mountable receiving rail 1000 can be of a unibody shape.

The device-mountable receiving rail 1000 can include two or more via holes 1014 for receiving mounting components (e.g., screws, bolts, clips, brackets, etc.) that attach the device-mountable receiving rail 1000 to the side portion of the rack-mountable computing device. The two or more via holes 1014 are located in positions that allow the device-mountable receiving rail 1000 to be attached to rack-mountable computing devices provided from multiple manufacturers, such as Cisco®, Juniper Networks® and Nvidia®, to name a few. Each of the two or more via holes 1014 does not necessarily need to be used (i.e., receive a mounting component) to mount the device-mountable receiving rail 1000 to the rack-mountable computing device, as different via holes 1014 may or may not line up with different receiving holes of the side of the rack-mountable computing device, depending upon the manufacturer and model.

The device-mountable receiving rail 1000 can also include one or more receiving holes 1016 configured to receive one or more protrusions located on the side of the rack-mountable computing device. The one or more receiving holes 1016 can be configured with a larger portion and a smaller portion, such that the one or more protrusions located on the side of the rack-mountable computing device can be first inserted into the larger portion and then slid into the smaller portion. Alternatively, the larger portion of the one or more receiving holes 1016 can be configured to receive a protrusion of a first size and the smaller portion of the one or more receiving holes 1016 can be configured to receive a protrusion of a second size, depending on the manufacturer and model of the rack-mountable computing device. The one or more receiving holes 1016, just as the two or more via holes 1014, are located in positions that allow the device-mountable receiving rail 1000 to be attached to rack-mountable computing devices provided from multiple manufacturers, such as Cisco®, Juniper Networks® and Nvidia®, to name a few. Each of the one or more receiving holes 1016 does not necessarily need to be used (i.e., receive a protrusion) to mount the device-mountable receiving rail 1000 to the rack-mountable computing device, as different receiving holes 1016 may or may not line up with different protrusions (or the lack thereof) of the side of the rack-mountable computing device, depending upon the manufacturer and model.

The device-mountable receiving rail 1000 illustrated in FIG. 10 can be installed on either the left side or the right side of the rack-mountable computing device. Although two device-mountable receiving rails 1000 are not illustrated, the universal rail kit can include another corresponding device-mountable receiving rail that can be installed on the other side of the rack-mountable computing device. This other corresponding device-mountable receiving rail can have the same structure as the device-mountable receiving rail 1000 illustrated in FIG. 10 or it can have a different structure as the device-mountable receiving rail 1000 illustrated in FIG. 10.

Figure 11:
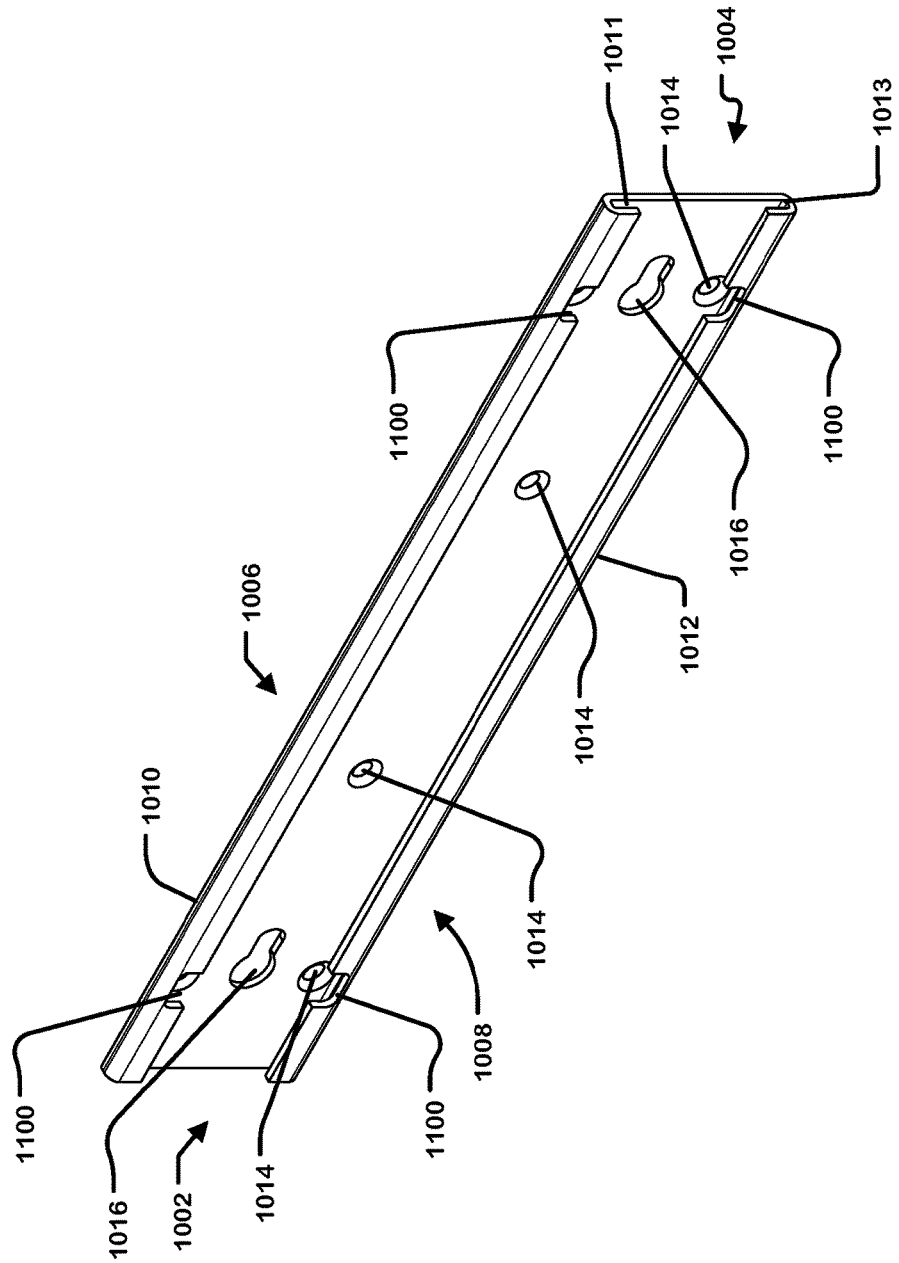
FIG. 11 illustrates a second perspective view of a device-mountable receiving rail of a universal rail kit.

FIG. 11 illustrates a second perspective view of a device-mountable receiving rail of a universal rail kit.

FIG. 11 illustrates the same device-mountable receiving rail 1000 as illustrated in FIG. 10 and redundant descriptions thereof are omitted. FIG. 11 further illustrates openings 1100 in a portion of the "U" shaped curved regions 1010 and 1012. The openings 1100 allow for insertion and removal of the mounting components (through the two or more via holes 1014) that attach the device-mountable receiving rail 1000 to the side of the rack-mountable computing device. The size of the openings 1100 must be commensurate with the size of the via holes 1014 and the size of the mounting components, such that the "U" shaped curved regions 1010 and 1020 do not block the insertion and removal of the mounting components. Further, as illustrated, the two or more via holes 1014 can be tapered so as to allow the mounting components to be flush with the surface of the device-mountable receiving rail 1000 so that the rack-mountable sliding rail 100 can slide into the device-mountable receiving rail 1000 without obstructions caused by the mounting components that may not be flush or near flush with the surface of the device-mountable receiving rail 1000.

Figure 12:
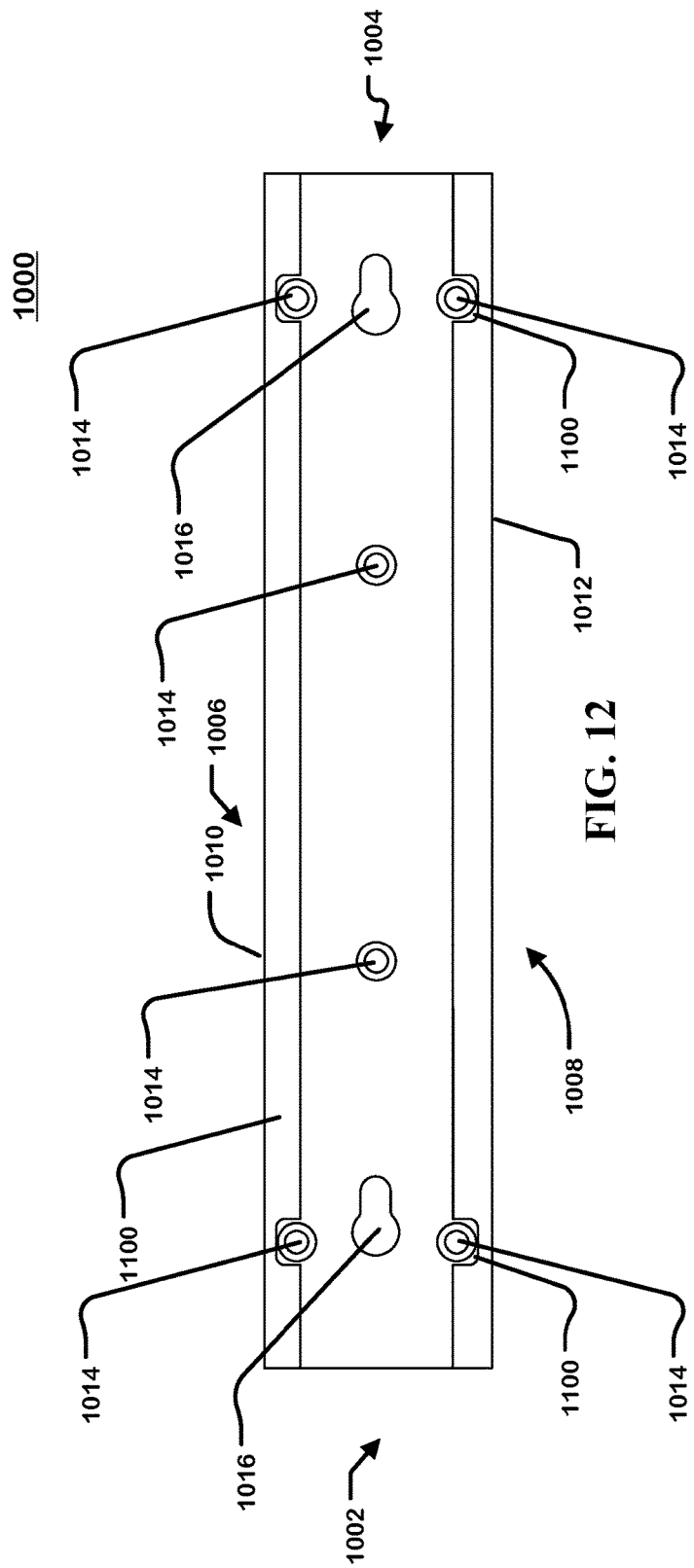
FIG. 12 illustrates a side view of a device-mountable receiving rail of a universal rail kit.

FIG. 12 illustrates a side view of a device-mountable receiving rail of a universal rail kit.

Specifically, FIG. 12 illustrates the same device-mountable receiving rail 1000 as illustrated in FIGS. 10 and 11 and redundant descriptions thereof are omitted.

Figure 13:
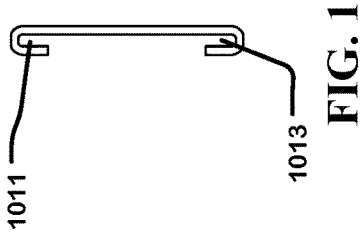
FIG. 13 illustrates an end view of a device-mountable receiving rail of a universal rail kit.

FIG. 13 illustrates an end view of a device-mountable receiving rail of a universal rail kit.

Specifically, FIG. 13 illustrates the same device-mountable receiving rail 1000 as illustrated in FIGS. 10-12 and redundant descriptions thereof are omitted.

Figures 14A, 14B:
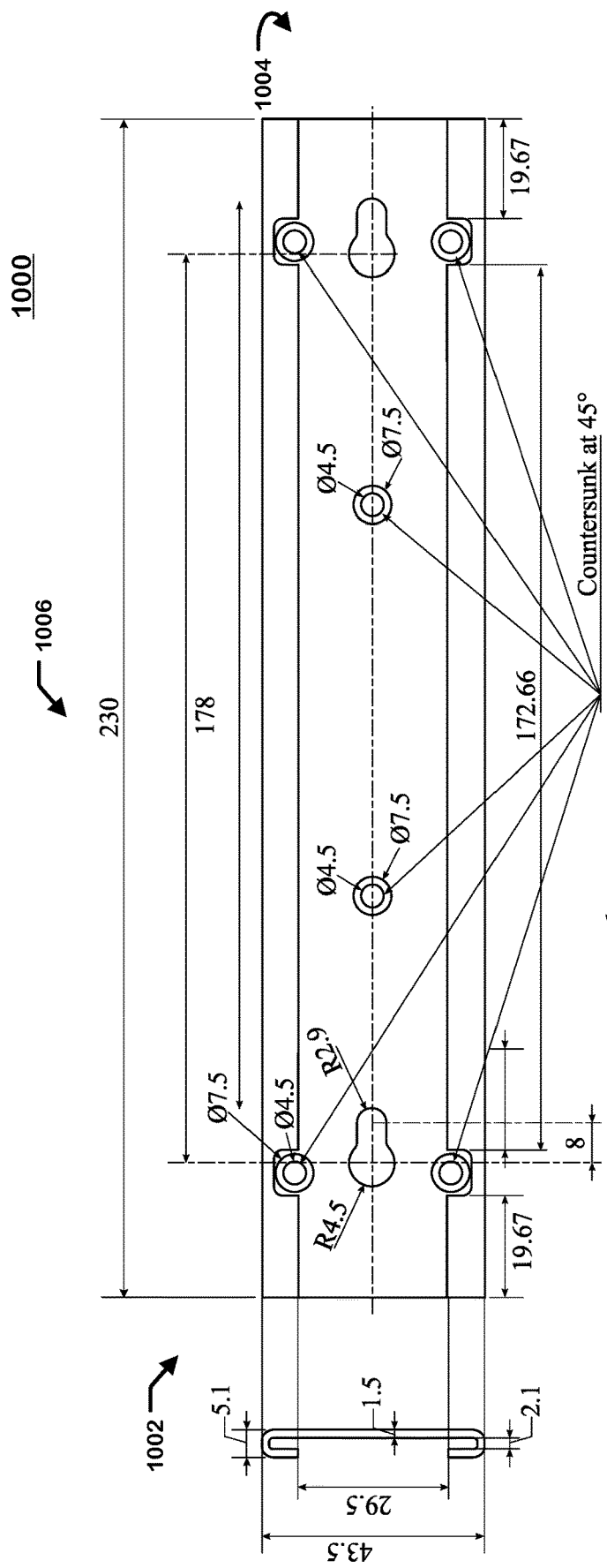
FIGS. 14A and 14B illustrate example dimensions of the structure of a device-mountable receiving rail of a universal rail kit.

FIGS. 14A and 14B illustrate example dimensions of the structure of a device-mountable receiving rail of a universal rail kit.

The measurements illustrated in FIGS. 14A and 14B are in millimeters (mm) and the "R" values indicate radius measurements in millimeters (mm). These measurements are merely examples and can be modified. The dimensions and shape of the device-mountable receiving rail 1000 allow the device-mountable receiving rail 1000 to be compatible with various brands and models of computer racks as well as with various brands and models of rack-mountable computing devices. Many of the reference elements illustrated in FIGS. 10-13 are not included in FIGS. 14A and 14B so as to allow for easier identification of the dimensions. Specifically, some of the reference elements referred to below are not illustrated in FIGS. 14A and 14B for the sake of clarity. However, it is clear from FIGS. 10-13 which portions of the device-mountable receiving rail are being referred to below.

While the various dimensions and shapes illustrated in FIGS. 14A and 14B are self-explanatory, they are briefly described below. The overall length of the device-mountable receiving rail 1000 is approximately 230 mm, the height of the device-mountable receiving rail is approximately 43.5 mm and a distance between edge portions of the "U" shaped curved regions 1010 and 1012 is approximately 29.5 mm. Further the overall width (thickness) of the device-mountable receiving rail 1000 is approximately 5.1 mm and the width (thickness) of the top-side track 1011 and the bottom-side track 1013 is approximately 2.1 mm.

The locations and dimension of the two or more via holes 1014 and the one or more receiving holes 1016 are clearly illustrated in FIG. 14B. The larger portions of the one or more receiving holes 1016 can have a radius measurement of R4.5 mm and the smaller portions of the one or more receiving holes 1016 can have a radius measurement of R2.9 mm. The outermost portions of the two or more via holes 1014 can have a diameter of approximately 7.5 mm (referring to the portions of the two or more via holes 1014 where the tapering or countersink begins). The innermost portions of the two or more via holes 1014 can have a diameter of approximately 4.5 mm (referring to the portions of the two or more via holes 1014 where the tapering or countersink ends). The tapering or countersink can be at 45 degrees, or any other value that matches the shape and contour of the mounting components.

Figure 15:
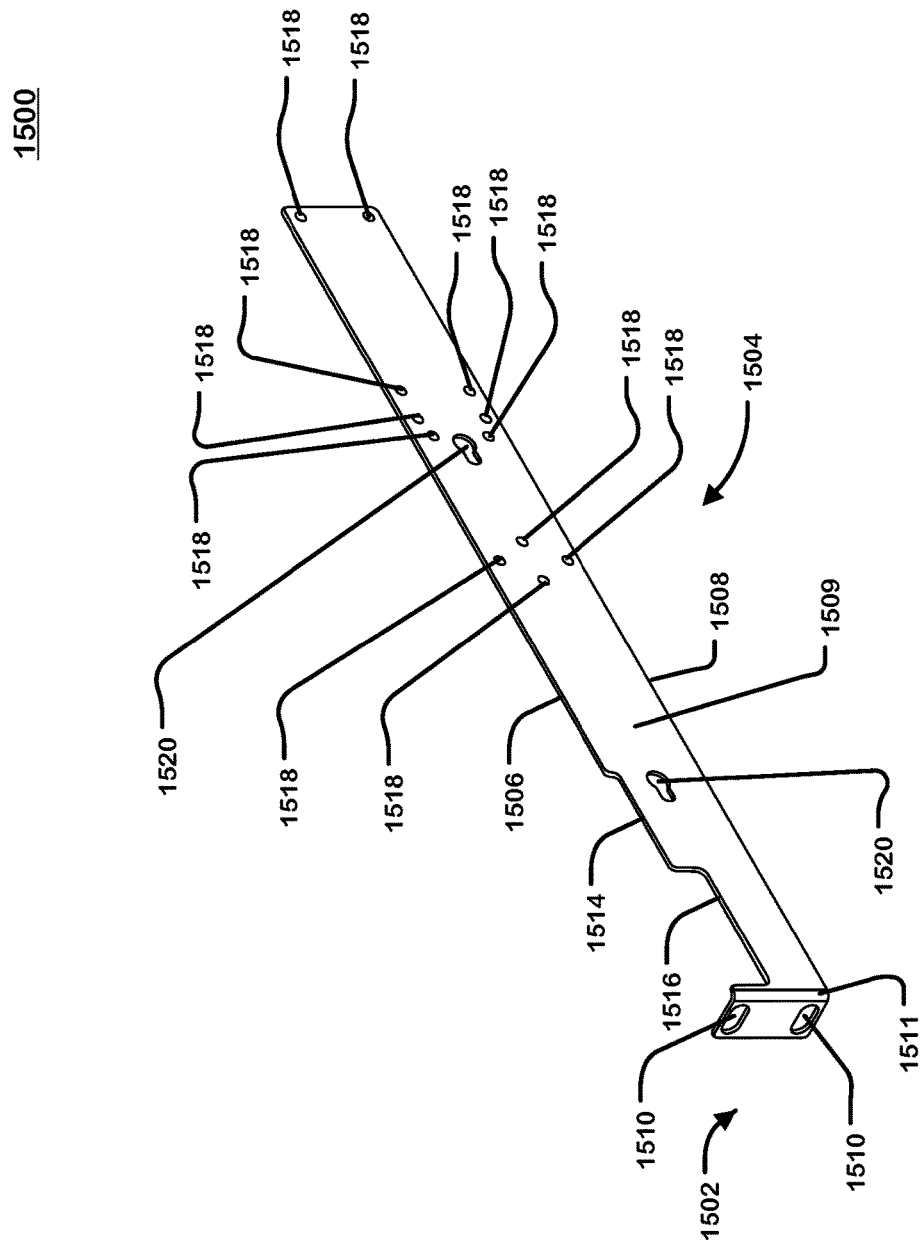
FIG. 15 illustrates a first perspective view of a device-mountable securing rail of a universal rail kit.

FIG. 15 illustrates a first perspective view of a device-mountable securing rail of a universal rail kit.

Specifically, FIG. 15 illustrates a device-mountable securing rail 1500 of the universal rail kit. The device-mountable securing rail 1500 is "L" shaped and has a first leg 1502 and a second leg 1504. The first leg 1502 is located at a proximal end of the device-mountable securing rail 1500 and the second leg 1504 extends from the proximal end of the device-mountable securing rail 1500 to a distal end of the device-mountable securing rail 1500. As illustrated, the first leg 1502 can be shorter than the second leg 1504.

The second leg 1504 includes a top portion 1506, a bottom portion 1508 and a first side 1509 that faces towards the rack-mountable computing device when it is installed within the computer rack. The second leg 1504 can have varying heights. For example, portions 1514 and 1516 of the second leg 1504 taper stepwise to a smaller height. This stepwise tapering can allow for additional space for a user to run cables and/or wires throughout the computer rack with the rack-mountable computing device installed.

A length of the first leg 1502 of the device-mountable securing rail 1500 extends in a direction that is substantially perpendicular to the length of the second leg 1504. As illustrated, the device-mountable securing rail 1500 can be of a unibody shape and the first leg 1502 and the second leg 1504 meet at a corner or rounded portion 1511 thereof.

The second leg 1504 can include two or more via holes 1518 for receiving mounting components (e.g., screws, bolts, clips, brackets, etc.) that attach the device-mountable securing rail 1500 to the side portion of the rack-mountable computing device. The device-mountable securing rail 1500 can be mounted (attached) to a proximal portion of the side of the rack-mountable computing device. The two or more via holes 1518 are located in positions that allow the device-mountable securing rail 1500 to be attached to rack-mountable computing devices provided from multiple manufacturers, such as Cisco®, Juniper Networks® and Nvidia®, to name a few. Each of the two or more via holes 1518 does not necessarily need to be used (i.e., receive a mounting component) to mount the device-mountable securing rail 1500 to the rack-mountable computing device, as different via holes 1518 may or may not line up with different receiving holes of the side of the rack-mountable computing device, depending upon the manufacturer and model.

The second leg 1504 of the device-mountable securing rail 1500 can also include one or more receiving holes 1520 configured to receive one or more protrusions located on the side of the rack-mountable computing device. The one or more receiving holes 1520 can be configured with a larger portion and a smaller portion, such that the one or more protrusions located on the side of the rack-mountable computing device can be first inserted into the larger portion and then slid into the smaller portion. Alternatively, the larger portion of the one or more receiving holes 1520 can be configured to receive a protrusion of a first size and the smaller portion of the one or more receiving holes 1520 can be configured to receive a protrusion of a second size, depending on the manufacturer and model of the rack-mountable computing device. The one or more receiving holes 1520, just as the two or more via holes 1518, are located in positions that allow the device-mountable securing rail 1500 to be attached to rack-mountable computing devices provided from multiple manufacturers, such as Cisco®, Juniper Networks® and Nvidia®, to name a few. Each of the one or more receiving holes 1520 does not necessarily need to be used (i.e., receive a protrusion) to mount the device-mountable securing rail 1500 to the rack-mountable computing device, as different receiving holes 1520 may or may not line up with different protrusions (or the lack thereof) of the side of the rack-mountable computing device, depending upon the manufacturer and model.

The first leg 1502 includes one or more via holes 1510 that allow the device-mountable securing rail 1500 to be mounted (attached) to a pillar of the computer rack using one or more mounting components, such as screw, bolts, clips or other devices that would be known to a person of ordinary skill in the art. The mounting components can be inserted into the via holes 1510 in order to mount the device-mountable securing rail 1500 to the pillar and they can be removed from the via holes 1510 in order to remove the device-mountable securing rail 1500 from the pillar and also remove the rack-mountable computing device from the computer rack.

The second leg 1504 of the device-mountable securing rail 1500 can first be mounted to the side of the rack-mountable computing device, as well as the device-mountable receiving rail 1000. The rack-mountable computing device can then be inserted into the rack so that the device-mountable receiving rail 1000 receives the already mounted rack-mountable sliding rail 100 such that the rack-mountable sliding rail 100 slides into the device-mountable receiving rail 1000. Once the rack-mountable computing device is fully inserted into the computer rack, the one or more via holes 1510 of the first leg 1502 can be mounted to the pillar or chassis component or chassis component of the computer rack, so as to securely mount the rack-mountable computing device to the computer rack. The rack-mountable computing device can be removed from the computer rack by simply removing the mounting components from the one or more via holes 1510 of the first leg 1502 and then sliding the rack-mountable computing device out of the computer rack. The structure of the rack-mountable sliding rail 100, the device-mountable receiving rail 1000 and the device-mountable securing rail 1500 allows the rack-mountable computing device to be removed without detaching the rack-mountable sliding rail 100 from the pillar of the computer rack, without detaching the device-mountable receiving rail 1000 from the rack-mountable computing device and without detaching the device-mountable securing rail 1500 from the rack-mountable computing device.

Although two device-mountable securing rails 1500 are not illustrated, the universal rail kit includes another corresponding device-mountable securing rail that can be mounted to the other side of the rack-mountable computing device and then mounted onto the other side of the computer rack. This other corresponding device-mountable securing rail can be a mirror of the device-mountable securing rail 1500 illustrated in FIG. 15 or it can have a structure that is different from the structure of the device-mountable securing rail 1500 illustrated in FIG. 15.

Figure 16:
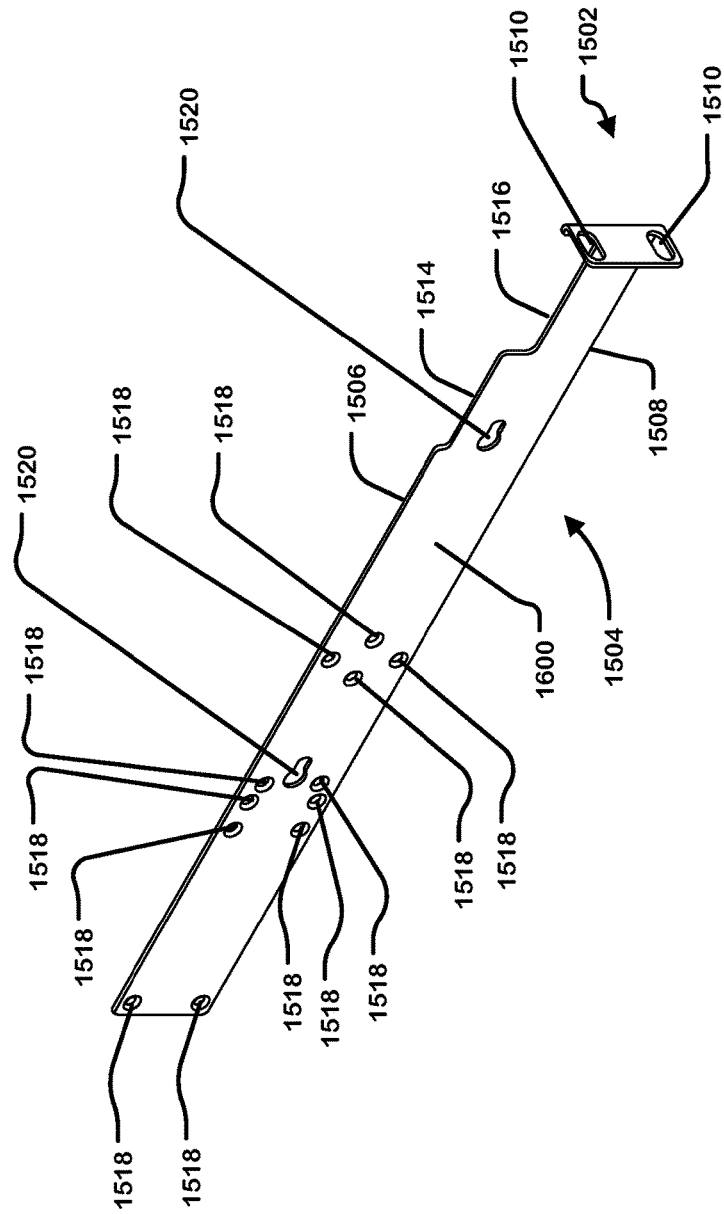
FIG. 16 illustrates a second perspective view of a device-mountable securing rail of a universal rail kit.

FIG. 16 illustrates a second perspective view of a device-mountable securing rail of a universal rail kit.

FIG. 16 illustrates the same device-mountable securing rail 1500 as illustrated in FIG. 15 and redundant descriptions thereof are omitted. FIG. 16 further illustrates a second side 1600 of the device-mountable securing rail 1500 that is not illustrated in FIG. 15.

Figure 17:
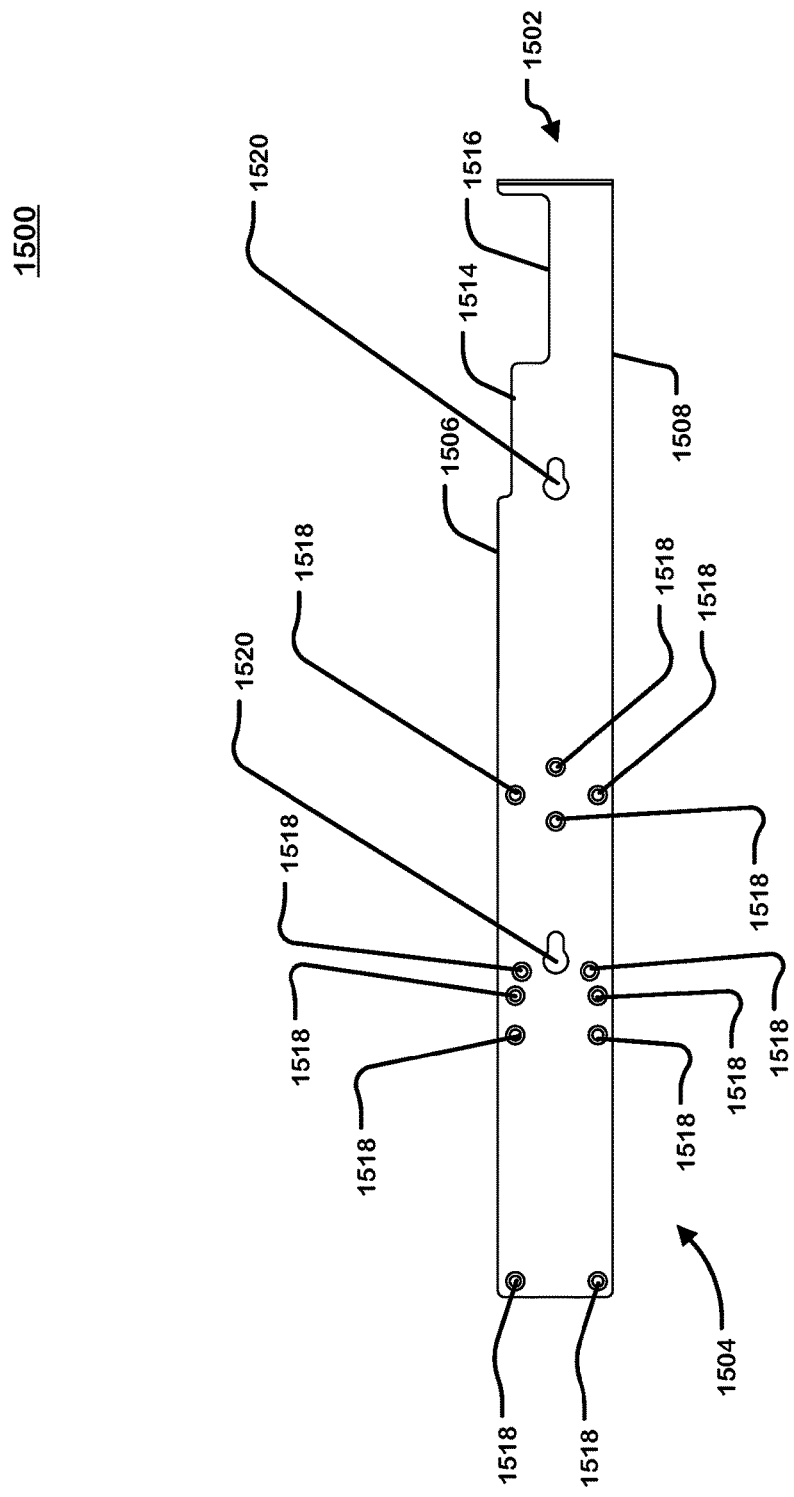
FIG. 17 illustrates a side view of a device-mountable securing rail of a universal rail kit.

FIG. 17 illustrates a side view of a device-mountable securing rail of a universal rail kit.

FIG. 17 illustrates the same device-mountable securing rail 1500 as illustrated in FIGS. 15 and 16 and redundant descriptions thereof are omitted.

FIGS. 18A, 18B and 19 illustrate example dimensions of the structure of a device-mountable securing rail of a universal rail kit.

The measurements illustrated in FIGS. 18A, 18B and 19 are in millimeters (mm) and the "R" values indicate radius measurements in millimeters (mm). These measurements are merely examples and can be modified. The dimensions and shape of the device-mountable securing rail 1500 allow the device-mountable securing rail 1500 to be compatible with various brands and models of computer racks as well as with various brands and models of rack-mountable computing devices. Many of the reference elements illustrated in FIGS. 15-17 are not included in FIGS. 18A, 18B and 19 so as to allow for easier identification of the dimensions. Specifically, some of the reference elements referred to below are not illustrated in FIGS. 18A, 18B and 19 for the sake of clarity. However, it is clear from FIGS. 15-17 which portions of the rack-mountable sliding rail are being referred to below.

While the various dimensions and shapes illustrated in FIGS. 18A, 18B and 19 are self-explanatory, they are briefly described below. The overall length of the device-mountable securing rail 1500 is approximately 418.02 mm, the height of the second leg 1504 (from the top portion 1506 to the bottom portion 1508) is approximately 43 mm. The height between portion 1514 and the bottom portion 1508 is less than the height from the top portion 1506 and the bottom portion 1508 and the height between portion 1516 and the bottom portion 1508 is less than the height from portion 1514 and the bottom portion 1508. Portion 1514 has a length of approximately 45.5 mm and portion 1516 has a length of approximately 55 mm.

Further, the first leg 1502 has a thickness of approximately 1.5 mm, a length of approximately 22 mm and a height of approximately 43 mm. Left and right portions of the via holes 1510 can have a radius measurement of approximately R3.95 mm and the via holes 200 can be spaced apart from each other approximately 31.75 mm from center points thereof.

The locations and dimension of the two or more via holes 1518 and the one or more receiving holes 1520 are clearly illustrated in FIGS. 18A and 18B. The larger portions of the one or more receiving holes 1520 can have a radius measurement of R4.5 mm and the smaller portions of the one or more receiving holes 1520 can have a radius measurement of R2.9 mm. The outermost and innermost portions of the two or more via holes 1518 can have diameters varying between approximately 3.5 mm and 4.1 mm. The two or more via holes 1518 can be tapered or countersunk at approximately 45 degrees, or any other value that matches the shape and contour of the mounting components.

Further, as illustrated in FIG. 19, the angle between the first leg 1502 and the second leg 1504 can be approximately 90 degrees with a radius measurement of approximately R1.5 mm.

Figure 20:
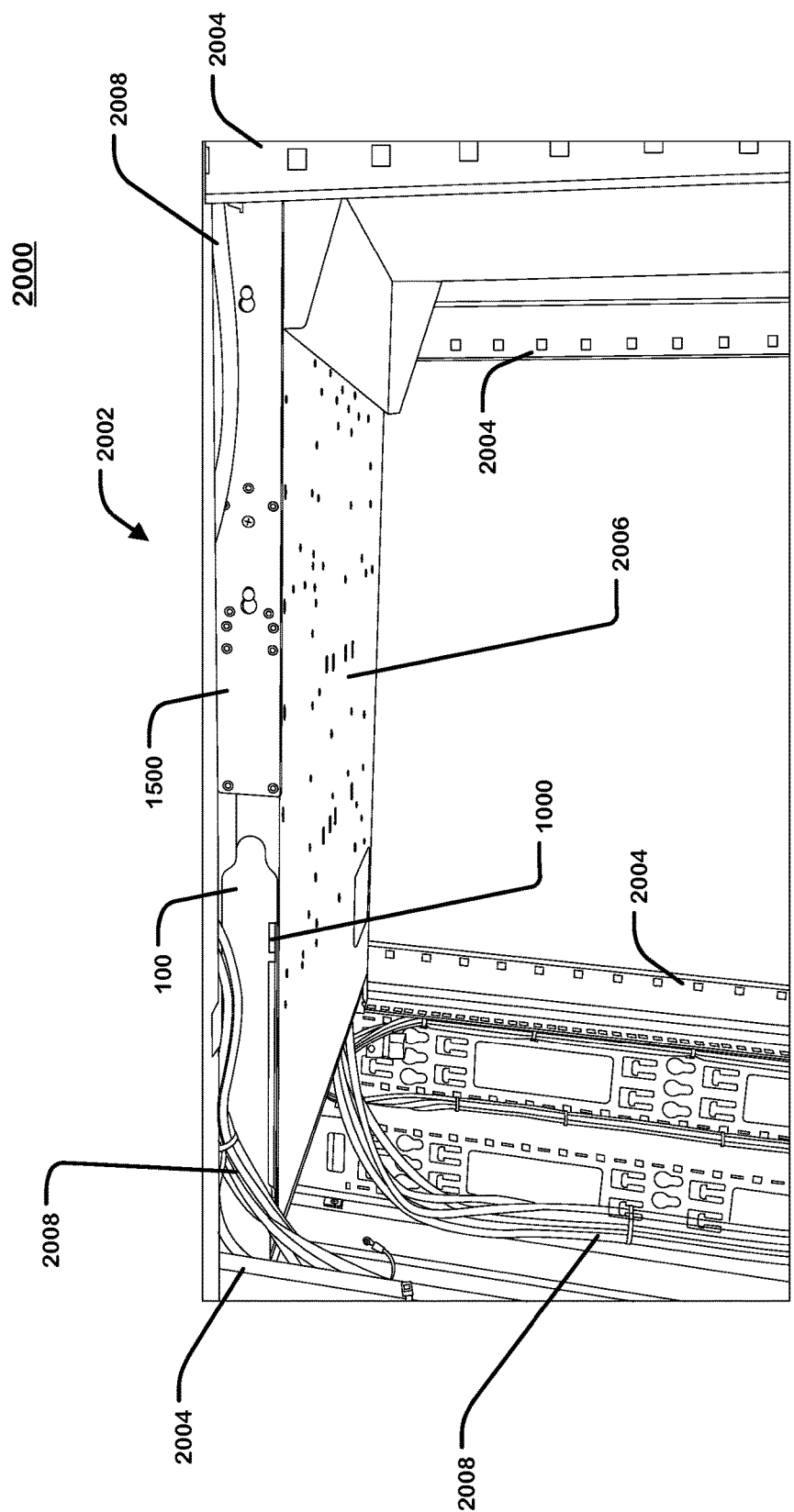
FIG. 20 illustrates a rack-mountable computing device installed in a computing rack using a universal rail kit.

FIG. 20 illustrates a rack-mountable computing device installed in a computing rack using a universal rail kit.

Specifically, FIG. 20 illustrates a computer system 2000 that includes a computer rack 2002 with pillars 2004 and a rack-mountable computing device 2006 installed therein using the universal rail kit. FIG. 20 also illustrates various cables and wires 2008 running next to and/or connected to the rack-mountable computing device 2006.

Further, as illustrated, the rack-mountable sliding rail 100 is mounted to one of the pillars 2004 and the device-mountable receiving rail 1000 is mounted to a side of the rack-mountable computing device 2006. FIG. 20 illustrates the rack-mountable sliding rail 100 as slid into and received by the device-mountable receiving rail 1000. FIG. 20 also illustrates the device-mountable securing rail 1500 mounted to the side of the rack-mountable computing device 2006 and a pillar 2004 of the computer rack 2002. As discussed above, the universal rail kit can include an additional set of the rack-mountable sliding rail 100, the device-mountable receiving rail 1000 and the device-mountable securing rail 1500 that can be attached to the other side of the rack-mountable computing device and the other side of the computer rack 2002 (i.e., different pillars 2004 of the computer rack 2002).

Figure 21:
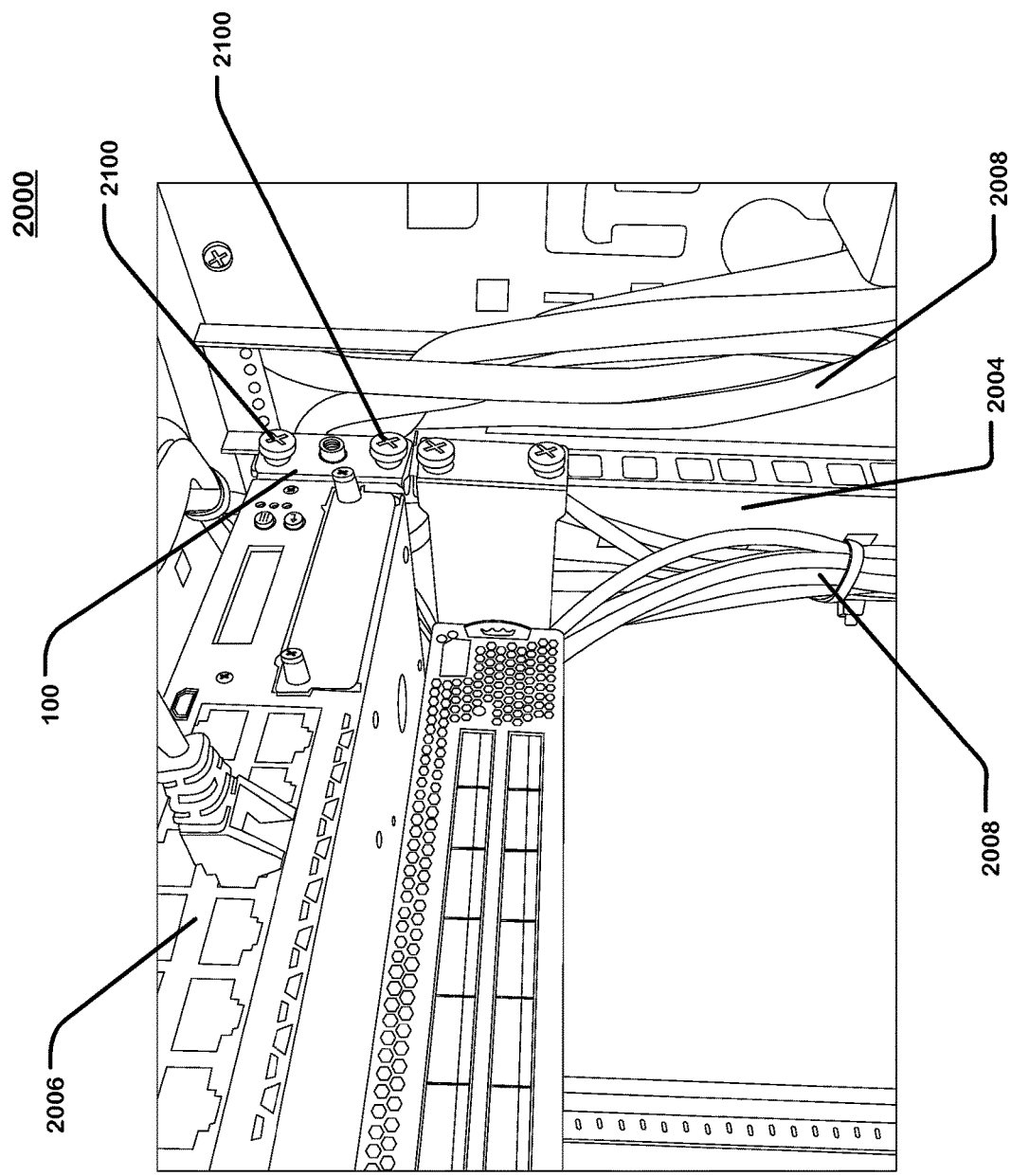
FIG. 21 illustrates a rack-mountable computing device installed in a computing rack using a universal rail kit.

FIG. 21 illustrates a rack-mountable computing device installed in a computing rack using a universal rail kit.

In addition to the several of the components illustrated in FIG. 20, FIG. 21 illustrates the rack-mountable sliding rail 100, as attached to a pillar 2004 using mounting components 2100, such as a screws.

Figure 22:
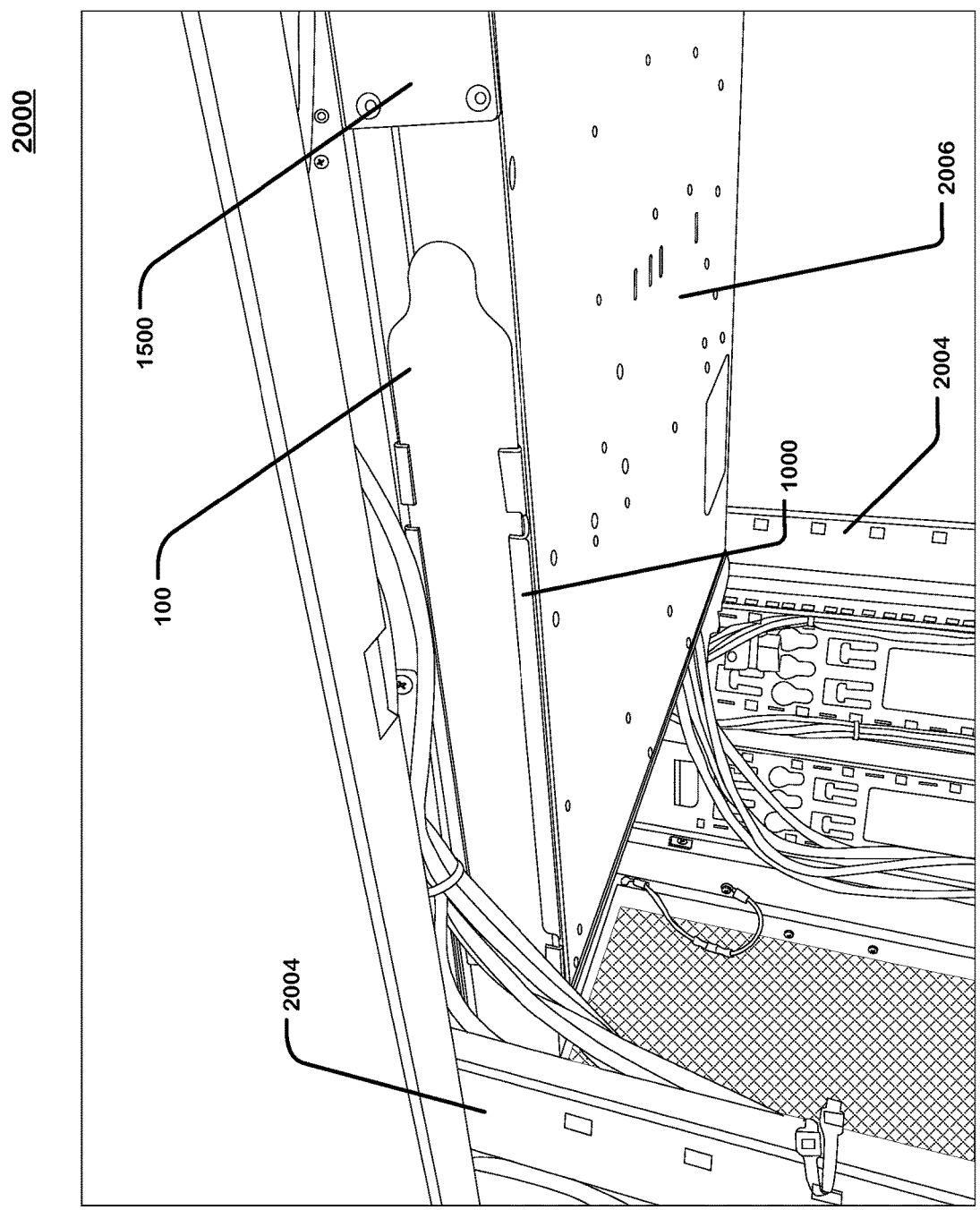
FIG. 22 illustrates a rack-mountable computing device installed in a computing rack using a universal rail kit.

FIG. 22 illustrates a rack-mountable computing device installed in a computing rack using a universal rail kit.

Specifically, FIG. 22 illustrates the same computer system 2000 as illustrated in FIGS. 20 and 21 and redundant descriptions thereof are omitted.

Figure 23:
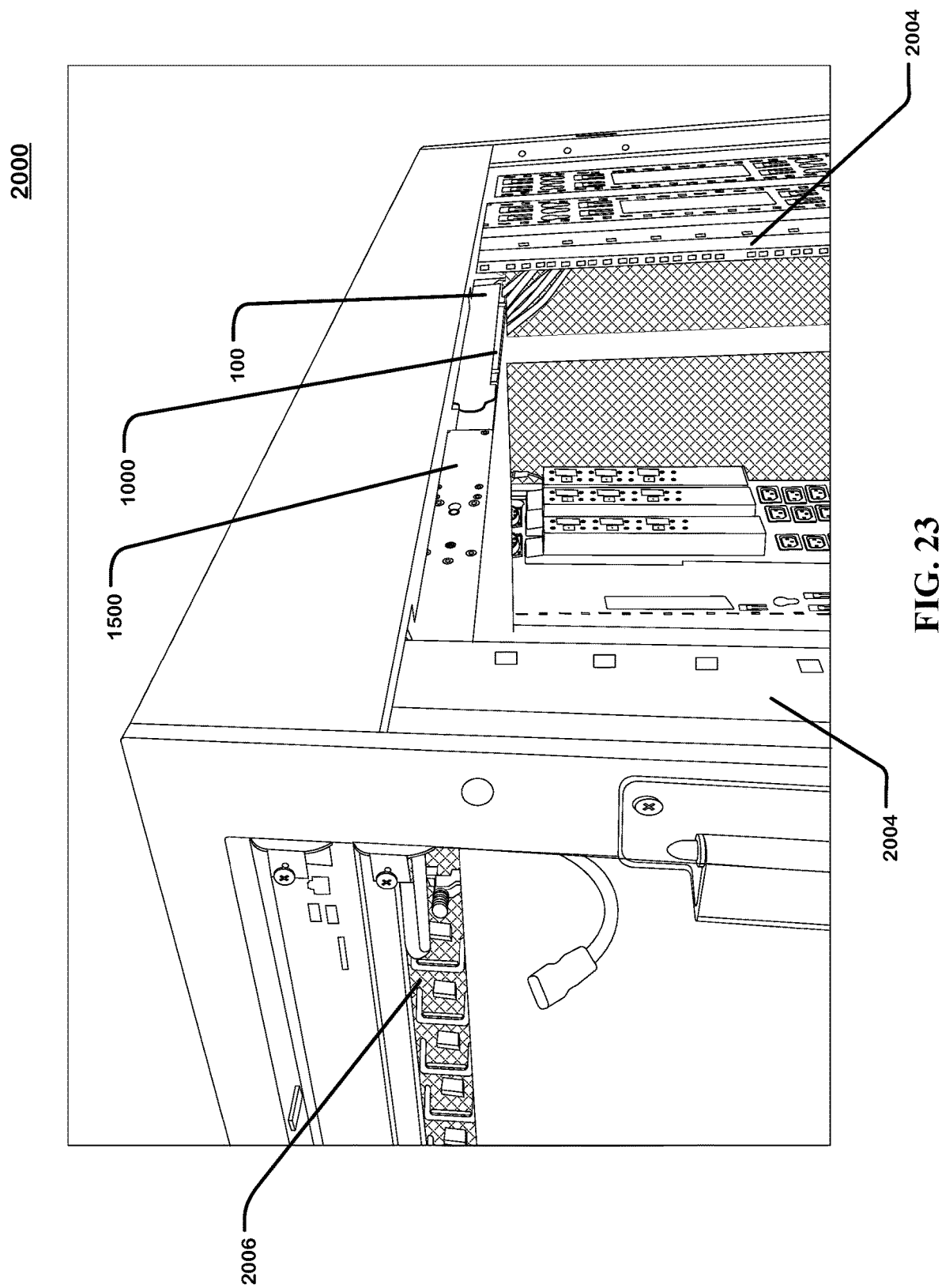
FIG. 23 illustrates a rack-mountable computing device installed in a computing rack using a universal rail kit.

FIG. 23 illustrates a rack-mountable computing device installed in a computing rack using a universal rail kit. FIG. 23 illustrates the same computer system 2000 as illustrated in FIGS. 20-22 and redundant descriptions thereof are omitted.

This disclosure is provided to reveal a preferred embodiment of the universal rail kit and a best mode for using the universal rail kit. Having thus described the universal rail kit in this way, it should be apparent that various different modifications can be made to the preferred embodiment without departing from the scope and spirit of this disclosure. When structures are identified as a means to perform a function, the identification is intended to include all structures which can perform the function specified. One or more elements of one or more claims can be combined with elements of other claims.

What is claimed is:

1. A universal rail mounting kit for mounting a rack-mountable computing device within a computer rack, the universal rail mounting kit comprising:
    a rack-mountableسliding rail configured to be attached to the computer rack;
    a device-mountable receiving rail configured to be attached to the rack-mountable computing device and configured to receive the rack-mountable sliding rail when the rack-mountable computing device is installed in the computer rack; and
    a device-mountable securing rail configured to be attached to the rack-mountable computing device and configured to secure the rack-mountable computing device to the computer rack after the device-mountable receiving rail has received the rack-mountable sliding rail,
    wherein the rack-mountable sliding rail has an "L" shaped structure comprising a distal end, a proximal end, a first leg located at the distal end and a second leg extending from the distal end to the proximal end, the first leg of the rack-mountable sliding rail being shorter than the second leg of the rack-mountable sliding rail,
    wherein the first leg of the rack-mountable sliding rail is configured to be mounted to a first pillar of the computer rack,
    wherein the device-mountable securing rail has an "L" shaped structure comprising a distal end, a proximal end, a first leg located at the proximal end and a second leg extending from the proximal end to the distal end, the first leg of the device-mountable securing rail being shorter than the second leg of the device-mountable securing rail,
    wherein the second leg of the device-mountable securing rail is configured to be mounted to and extend along a side of the rack-mountable computing device, and wherein, upon insertion of the second leg of the rack-mountable sliding rail into the device-mountable receiving rail, the first leg of the device-mountable securing rail is configured to be mounted to a second pillar of the computer rack opposite to the first pillar.

2. The universal rail mounting kit of claim 1, wherein the first leg of the rack-mountable sliding rail includes at least one via hole for receiving a mounting component that attaches the first leg of the rack-mountable sliding rail to the first pillar of the computer rack.

3. The universal rail mounting kit of claim 1, wherein the second leg of the rack-mountable sliding rail is configured to extend along a side of the rack-mountable computing device when the first leg of the rack-mountable sliding rail is mounted to the first pillar of the computer rack and the rack-mountable computing device is installed within the computer rack.

4. The universal rail mounting kit of claim 1, wherein the second leg, at the proximal end of the rack-mountable sliding rail, includes a rounded portion to provide guidance to the device-mountable receiving rail as the rack-mountable computing device is installed within the computer rack.

5. The universal rail mounting kit of claim 4, wherein the second leg, at the proximal end of the rack-mountable sliding rail, is further tapered from the rounded portion to provide further guidance to the device-mountable receiving rail as the rack-mountable computing device is installed within the computer rack.

6. The universal rail mounting kit of claim 1,
wherein the first leg of the rack-mountable sliding rail has a first end connected to the second leg of the rack-mountable sliding rail and a second end opposing the first end, and
wherein the second leg, at the proximal end of the rack-mountable sliding rail, is angled in a direction towards the second end of the first leg of the rack-mountable sliding rail to provide guidance to the device-mountable receiving rail as the rack-mountable computing device is installed within the computer rack.

7. The universal rail mounting kit of claim 1,
wherein the device-mountable receiving rail includes a distal end, a proximal end, a top side and a bottom side,
wherein the top side forms a "U" shaped curved region configured to curve away from a side of the rack-mountable computing device and to form a top-side track extending along a portion of a length of the device-mountable receiving rail, and
wherein the bottom side forms a "U" shaped curved region configured to curve away from the side of the rack-mountable computing device and to form a bottom-side track extending along a portion of a length of the device-mountable receiving rail.

8. The universal rail mounting kit of claim 7,
wherein the second leg of the rack-mountable sliding rail includes a top side extending along a portion of a length thereof and a bottom side extending along a portion of a length thereof,
wherein the top-side track of the device-mountable receiving rail is configured to receive a top side of the second leg of the rack-mountable sliding rail, and
wherein the bottom-side track of the device-mountable receiving rail is configured to receive a bottom side of the second leg of the rack-mountable sliding rail.

9. The universal rail mounting kit of claim 7, wherein at least one of the "U" shaped region of the top side of the device-mountable receiving rail and the "U" shaped curved region of the bottom side of the device-mountable receiving rail includes one or more openings adjacent to one or more via holes of the device-mountable receiving rail to allow for insertion and removal of mounting components.

10. The universal rail mounting kit of claim 1, wherein the second leg of the device-mountable securing rail is stepwise tapered towards the proximal end of the device-mountable securing rail to provide a reduced a height of the second leg at the proximal end of the device-mountable securing rail in comparison to a height of the second leg at the distal end of the device-mountable securing rail.

11. The universal rail mounting kit of claim 1,
wherein the device-mountable securing rail includes two or more via holes for receiving mounting components that attach the device-mountable securing rail to a side portion of the rack-mountable computing device, and
wherein the two or more via holes are located in positions that allow the device-mountable securing rail to be attached to rack-mountable computing devices provided from multiple manufacturers.

12. The universal rail mounting kit of claim 11,
wherein the device-mountable securing rail includes one or more receiving holes configured to receive one or more protrusions located on the side portion of the rack-mountable computing device, and
wherein the one or more receiving holes are located in positions that allow the device-mountable securing rail to be attached to rack-mountable computing devices provided from multiple manufacturers.

13. The universal rail mounting kit of claim 12, wherein the multiple manufacturers include two or more of Cisco®, Juniper Networks® and Nvidia®.

14. The universal rail mounting kit of claim 1,
wherein the device-mountable receiving rail includes two or more via holes for receiving mounting components that attach the device-mountable receiving rail to a side portion of the rack-mountable computing device, and
wherein the two or more via holes are located in positions that allow the device-mountable receiving rail to be attached to rack-mountable computing devices provided from multiple manufacturers.

15. The universal rail mounting kit of claim 14,
wherein the device-mountable receiving rail includes one or more receiving holes configured to receive one or more protrusions located on the side portion of the rack-mountable computing device, and
wherein the one or more receiving holes are located in positions that allow the device-mountable receiving rail to be attached to rack-mountable computing devices provided from multiple manufacturers.

16. The universal rail mounting kit of claim 1,
wherein the rack-mountable sliding rail, the device-mountable receiving rail and the device-mountable securing rail are configured to attach to a left side of the rack-mountable computing device, and
wherein the universal rail mounting kit includes a complementary second set of components including another rack-mountable sliding rail, another device-mountable receiving rail and another device-mountable securing rail, which are configured to attach to a right side of the rack-mountable computing device.

17. A method of installing a rack-mountable computing device within a computer rack using a universal rail mounting kit,
wherein the universal rail mounting kit comprises:
a rack-mountable sliding rail comprising a first leg and a second leg forming an "L" shaped structure and configured to be attached to the computer rack;

a device-mountable receiving rail configured to be attached to the rack-mountable computing device and configured to receive the second leg of the rack-mountable sliding rail when the rack-mountable computing device is installed in the computer rack; and a device-mountable securing rail comprising a first leg and a second leg forming an "L" shaped structure and configured to be attached to the rack-mountable computing device and configured to secure the rack-mountable computing device to the computer rack after the device-mountable receiving rail has received the rack-mountable sliding rail, and wherein the method comprises:

attaching the first leg of the rack-mountable sliding rail to a first pillar of the computer rack;

attaching the device-mountable receiving rail to a distal portion of a side of the rack-mountable computing device;

attaching the device-mountable securing rail to a proximal portion of the side of the rack-mountable computing device;

installing the rack-mountable computing device within the computer rack by sliding the device-mountable receiving rail attached to the rack-mountable computing device to receive rack-mountable sliding rail; and securing the first leg of the device mountable securing rail to a second pillar of the computer rack opposite to the first pillar.

* * * * *